US00RE36760E

United States Patent [19]

Bloomquist et al.

[11] E Patent Number: Re. 36,760

[45] Reissued Date of Patent: Jul. 4, 2000

[54] METHOD AND APPARATUS FOR ALTERING MATERIAL USING ION BEAMS

[75] Inventors: Douglas D. Bloomquist, Albuquerque, N. Mex.; Rudy Buchheit, Columbus, Ohio; John B. Greenly, Lansing, N.Y.; Dale C. McIntyre, Albuquerque, N. Mex.; Eugene L. Neau, Albuquerque, N. Mex.; Regan W. Stinnett, Albuquerque, N. Mex.

[73] Assignee: Sandia Corporation, Albuquerque, N. Mex.

[21] Appl. No.: 09/108,325

[22] Filed: Jul. 1, 1998

Related U.S. Patent Documents

Reissue of:

[64] Patent No.: 5,532,495
Issued: Jul. 2, 1996
Appl. No.: 08/317,948
Filed: Oct. 4, 1994

U.S. Applications:

[63] Continuation-in-part of application No. 08/153,248, Nov. 16, 1993, Pat. No. 5,473,165.

[51] Int. Cl.[7] ..... G21K 5/04

[52] U.S. Cl. ..... 250/492.21; 250/492.3; 250/492.1

[58] Field of Search ..... 250/492.21, 492.2, 250/492.1, 492.3; 427/523; 437/2, 174

[56] References Cited

U.S. PATENT DOCUMENTS

| | | | |
|---|---|---|---|
| 4,447,761 | 5/1984 | Stinnett | 250/423 R |
| 4,587,430 | 5/1986 | Adler | 250/423 R |
| 4,733,073 | 3/1988 | Becker et al. | 250/423 P |
| 4,733,091 | 3/1988 | Robinson | 250/442.11 |
| 4,764,394 | 8/1988 | Conrad | 427/38 |

OTHER PUBLICATIONS

Harjes et al., "Status of the Repetitive High Energy Pulsed Power Project" 8th IEEE International Pulsed Power Conference, pp. 543–548, Jun. 1991.

Stinnet et al., "Surface Treatment With Pulsed Ion Beams", Division of Plasma Physics, Seattle, WA, Nov. 1992.

Greenly et al., "Plasma–Anode Ion Diode Research at Cornell" 8th Intl. Conf. on High–Power Particle Beams, pp. 199–206, Jul. 1990.

*Primary Examiner*—Jack I. Berman
*Attorney, Agent, or Firm*—McDermott, Will & Emery

[57] ABSTRACT

A method and apparatus for treating material surfaces using a repetitively pulsed ion beam. In particular, a method of treating magnetic material surfaces in order to reduce surface defects, and product amorphous fine grained magnetic material with properties that can be tailored by adjusting treatment parameters of a pulsed ion beam. In addition, to a method of surface treating materials for wear and corrosion resistance using pulsed particle ion beams.

85 Claims, 8 Drawing Sheets

METHOD AND APPARATUS FOR ALTERING MATERIAL USING ION BEAMS

Matter enclosed in heavy brackets [ ] appears in the original patent but forms no part of this reissue specification; matter printed in italics indicates the additions made by reissue.

This application is a Continuation-In-Part of U.S. patent application Ser. No. 08/153,248 filed Nov. 16, 1993[.] *now U.S. Pat. No. 5,473,165.*

The United States Government has rights in this invention pursuant to Contract No. DE-AC04-76DP00789.

FIELD OF THE INVENTION

This invention relates generally to material modification, and more specifically to a class of techniques whereby a thin layer of material on the surface of a body can be rapidly heated, followed by a rapid quench as the heat energy is conducted into the body. The invention also relates to other types of surface treatment using ion beams to convey energy to a near-surface region.

BACKGROUND

The mechanical and chemical properties of surfaces are an important factor in almost all materials applications. Numerous techniques have been developed to enhance these properties for particular applications. These techniques range from widely used techniques such as galvanizing and heat treatment of alloys to specialty techniques such as ion implantation and laser glazing which are expensive and not scaleable to common industrial use. The use of surface treatments to improve properties such as surface hardness, wear resistance, corrosion resistance, and fatigue lifetime add significant value to a wide range of products in industries including automobile manufacture, aerospace, microelectronics, tool and die manufacture, power generation, and the production of steel, aluminum, ceramics, and plastics.

Thermal treatment to alter the surface properties of materials has been a standard industrial process since the early smiths developed techniques for pack carburization of cast iron in their forges to produce a material more suited to the fabrication of durable swords. Such treatments, principally metallurgical in nature, have thus formed a part of manufacturing technology for more than a thousand years.

Two primary driving forces are available through the use of thermal treatments. The first involves the use of high temperature to overcome kinetic barriers which keep something from happening. The second is based on the rapid quenching of hot material to preserve, in some degree, the microstructure of the hot material or that of a metastable structure encountered in the evolution toward the quenched material.

The metallurgy of sword blades, although not understood at the time and developed through empirical research, represents the pinnacle of materials engineering during the Dark Ages. It also serves to demonstrate various surface treatment modalities which are still of primary importance.

In the Dark Ages, iron was generally produced as wrought iron, i.e., as a matrix of nearly pure iron with a relatively high density of slag inclusions. (Slag is the combination of impurities and the flux used in the reduction of iron ore.) Wrought iron is reasonably tough, but is very soft, and hence not well suited to the production of weapons. It is possible to harden the material by cold-working in the course of shaping, thus producing a work-hardened material, but this material is brittle as well as hard. Thus, a method that hardened only the surface layers would produce a superior weapon, one which would both hold an edge and take an impact without fracture.

The process most often used to this end was pack carburization. A sword was forged (hammered) into shape, producing a hard but brittle implement. The sword was then packed in a mixture of carbon (charcoal or coke) and other organic materials. The pack was heated to the carburizing temperature (about 950° C.), whereupon carbon was transferred to the steel by decomposition of carbon monoxide at the iron surface. The carbon diffused into the iron, forming a crude form of hypereuctectoid iron surrounding a wrought iron core. This is a thermodynamically favorable process which requires heating to yield significant diffusion in a reasonable amount of time.

The sword was then heated to above the transformation temperature (723° C.). As a result, the iron core was left unchanged, whereas the steel tegument transformed into a mixed phase of austenite and cementite. (Austenite is the γ-phase of iron with dissolved some carbon, while cementite is $Fe_3C$, a hard brittle substance.) The sword was then quenched abruptly to prevent the austenite-cementite mixed phase of the tegument from transforming back into the original material. (This step uses the second of the primary thermal treatments, using rapid quenching to preserve a high-temperature structure.) This quenching was usually performed by plunging the hot sword into oil, but some texts insisted that the finest swords resulted from quenching by thrusting the hot sword through the body of a young boy or a virgin maiden. The popularity of these latter practices is not recorded.

The structure resulting from the above steps was a strong, tough iron core surrounded by a thin (<1 mm) layer of fine-grain high-carbon steel having high hardness but low toughness. The high carbon-steel tegument of the sword can now be sharpened to a fine edge, which will last through much use, while the soft iron core will allow deformation on impact, thus avoiding brittle fracture of the sword blade. The relative quality of local surface treatments of wrought iron was an important factor in determining the outcome of many early political disagreements.

Surface treatment of a wide range of materials is still extremely important in modern manufacturing. Considering only steel for a moment, carburizing is still widely used to produce a hard surface on steels, but has been joined by a wide range of related techniques including nitriding (including iron nitriding), carbonitriding, cyaniding, and liquid carburizing. Thermal treatment alone is also used to harden the surfaces of medium and high-carbon steels, where there is already enough carbon to form the austenite-cementite mixed phase using heating alone. However, in these cases only the surface must be heated, leading to the development of numerous techniques for heating only the surface of a body, including pulsed inductive heating, where heat is generated by induction of eddy currents, which are confined primarily to the near-surface region in a conducting body, direct heating by a flame followed by quenching quickly enough that the inner regions of the body are not heated past the transformation temperature, and laser hardening, in which a very thin layer of the surface is heated quickly enough that quenching is accomplished by simple thermal conduction into the body of the part being hardened. Laser hardening is an early example of the type of process of interest in the present application, i.e., a rapid heat-rapid quench process. Finally, a work hardened surface can also be formed by heating a thin surface layer sufficiently that it ablates from the bulk of the material, creating shock waves which create dislocations in the near-surface regions.

Other purposes than hardening can be served by surface treatment of materials. For example, in steels, the chromizing process (diffusing chromium from an external source) increases the corrosion resistance of the material by turning the surface region into a form of stainless steel which may or may not be harder than the initial material, but will resist the action of oxidants and other common sources of corrosion. However, many other materials, including metals, alloys, semiconductors, ceramics, and other nonmetals are subject to corrosive effects. These include galvanic corrosion, in which a current is generated between two dissimilar metals in electrical contact, resulting in a soluble species being generated from one of the metals. Another form of corrosion is pitting, in which a passivation (or protecting) layer is breached in a small area (a pit). The material underneath, which is usually protected by the passivation layer, is then exposed to the corrosive environment, and dissolves inward from the position of the pit. (Note that a passivation layer may be intrinsic, as in the oxide layer on aluminium, or extrinsic, as in the surface layer of zinc in galvanized steel.) Corrosion can also be stimulated by tensile stress, biological organisms, and atmospheric contamination. A side effect of corrosion mechanisms can be hydrogen embrittlement, in which the hydrogen generated by a corrosive process enters into a metal or alloy, reducing the ductility of the material, which is then weakened, allowing surface flaws to grow under a stress, thus increasing the susceptibility of the material to further corrosion and eventual failure under stress. Many methods exist to reduce the pernicious effects of corrosion, but it is estimated that some 4% of the gross national product is still lost to corrosive effects.

One type of surface treatment to improve corrosion resistance which is consistent with the class of treatments under discussion here, i.e., rapid heat-rapid quench techniques, is the formation of surface alloy layers by forming a layer of a second material on the object to be protected, and then melting the surface layers to form a homogeneous liquid material. If the quenching is then rapid enough, a solid solution results even if an equilibrium alloy cannot be formed at a low temperature. The solid solution may be amorphous nanocrystalline, microcrystalline, or actual precipitates may form, depending on the rate of quenching. A small amount of precipitation will still allow corrosion resistance to be improved, and may increase the hardness of the treated surface layer.

Surface treatments are also important in the control of wear, which constitutes the primary reason why the artifacts of society become useless and have to be replaced. Wear is simply the removal of material from a solid surface as a result of sliding action. Wear is occasionally a useful process (e.g., writing with pencil and paper), but more often is deleterious to both the structure and the operation of mechanisms. There are four primary types of wear, adhesive, abrasive, corrosive, and fatigue wear. Adhesive wear arises from the formation, during sliding, of regions (called junctions) of adhesive bonding on a microscopic scale. If the junctions do not break along their original interfaces upon further sliding, then a chunk from one of the surfaces will have been transferred to the other surface. Such particles constitute wear in their formation, and may also add to abrasive wear. Abrasive wear is produced by a hard object being dragged along a softer one, thereby digging out a groove. The abrasive agent may be one of the surfaces, particles removed from the surfaces by other wear mechanisms, or external particles, such as sand in a bearing. Corrosive wear occurs when sliding action takes place in a corrosive environment, the pieces are nominally protected by a passivating layer, and the sliding action continuously removes the passivating layer, thus exposing fresh surfaces to the action of the corrosive. Fatigue wear occurs as cracks form and grow as the result of fatigue, especially in rolling systems. A crack forms below the surface, and grows to intersect the surface, thereby lifting a large particle out of the surface.

The various forms of wear are often synergistic, resulting in a form of degradation which is nearly universal in any mechanism or device having moving parts. Adhesive wear is the most fundamental, existing in any sliding or rotating contact in which two surfaces touch. The primary line of defense against wear is the use of lubricants, which act to prevent contact of surfaces in relative motion, thus reducing wear by as much as a million times the dry value. However, unless the relative velocities of the surfaces is high enough that the surfaces 'surf' on a continuous film of lubricant, there will still be contact and adhesive wear will occur.

The condition of the sliding surfaces helps to determine the rate of wear. The friction between a pair of sliding surfaces having large surface roughness will be approximately the same as that between similar surfaces having smoother surfaces. The friction in the first case is the work done in tearing apart a few large junctions, whereas in the second case the friction results from tearing apart many small junctions, but the total surface area of the junctions (and hence the work required to tear them asunder) is determined primarily by the amount of deformation of the surfaces caused by the force normal to the surfaces, which is the same in both cases.

From the point of view of the wear occurring during sliding, however, the difference in surface roughness makes several important contributions. Take $\lambda$ as a length characterizing the surface roughness. (In some cases the appropriate length will be the grain size rather than the surface roughness, but the arguments below still hold.) It is clear that $\lambda$ will also characterize the size of the particles torn off by adhesive wear. That is, if $\lambda$ is 10 times larger, the size of the detached particles will also be 10 times larger. Smaller particles will contribute less to abrasive wear mechanisms.

The difference in size of the detached particles resulting from differing degrees of surface roughness yields another advantage. A simple scaling argument will illustrate this. Assume $\lambda_R$ for the rough surface is 10 times larger than $\lambda_S$ for the smoother surface. Under equal external loading, the areas of contact will be the same. As each junction now has an area on the order of $\lambda^2$ there must be 100 times as many junctions on the smooth surface as on the tough surface. Further assume, as above, that the characteristic size of the detached particles is $\sim\lambda$. The volume of material detached by adhesive wear is then $\sim N\lambda^2$, where $N\sim\lambda^2$ is the number of particles formed by adhesive wear. The total volume of material removed by adhesive wear in a given sliding process is thus proportional to the size of the surface roughness. In summary, smoother surfaces, despite producing the same friction, result in less direct adhesive wear because of the square-cube scaling law above, and also reduce the amount of self-abrasive wear by reducing the size of the abrasive particles generated during adhesive wear. Such surfaces can be fabricated by melting the surface layers of the body and allowing the heat energy to dissipate into the body, thus obtaining rapid quenching of the liquid.

Fatigue wear can also be affected by surface morphology, but not primarily by the length scale of the surface roughness. More important here is the presence of abrupt structures, such as cracks, ledges, overhangs, etc., which offer sites for stress concentration, and the earlier material failure accompanying such concentration. Such stress concentration does not depend on the length scale of the defect, but rather on its shape. This type of wear will be reduced if the surface can be treated to have more gradual changes in surface morphology. Again, surface morphology can be altered to provide less opportunity for stress concentration by rapidly melting the surface layers and quenching the heat energy into the body of the material in question. Such smoother surfaces will also serve to limit various mechanisms for corrosion.

The potential applications for rapidly heating (and perhaps melting) a thin surface layer which is then self-quenched via thermal conduction into the body of an object are very broad. Beyond those described in detail above, one may alter the surface layers of a material. This may be done in a number of ways, but the main route toward such alterations is the ability of rapid quenching to produce non-equilibrium structures, such as amorphous or nanocrystalline surface layers. Metastable surface alloys can be produced by rapid melting and quenching. This requires a material system in which a thin layer of material A is formed on a substrate B. The phase diagram of these materials is such that they are immiscible when solid, but form a single-phase liquid when molten. (Heating above the melting point may be required.) If this material is then rapidly quenched, an amorphous alloy composed of the two components will result. If the quenching process is somewhat slower, nanoscale precipitates will form. The size of these precipitates depends on the cooling rate. Note that these materials need not be metals. A coating of gold on a germanium substrate melted and rapidly quenched will form such as amorphous alloy. Compounds including members of the metalloids are well known as helpful in formation of amorphous material.

When the pulse energy is much greater than that required to melt the heated surface layer, the surface layer will ablate. This can have three desirable effects. One is to serve as a source of pure material for an associated deposition process analogous to sputtering, but providing greatly enhanced purity and smoothness of the deposited material. It is also possible to obtain unique surface structures, which have, for example, altered electron emission characteristics, by ablating a surface layer from a substrate. Some of the ablated material will redeposit on the substrate, forming the aforementioned unique structures. Third, the shock wave created in the substrate by such ablation produces work-hardening effects far into the material (perhaps several hundred microns) through formation of dislocation structures below the heated surface layer.

Another application of a rapid heating-rapid quenching cycle is to clean a surface without altering the properties of the surface in any manner. This would be possible when the contaminant will desorb from the surface at a temperature lower than the melting point of the surface. Properly done, only a very thin ($<<\mu$m) layer of the surface would have to be heated to remove contaminants compatible with this method without the use of solvents or other chemicals. Such a process could replace many cleaning steps presently required in machining and semiconductor manufacture, to name only two possibilities. This is an important consideration in these days of heightened ecological awareness and regulation.

The surfaces of porous and/or highly defective materials such as ceramics can be smoothed and rendered resistant to crack nucleation by forming a surface layer of glass using the same type of rapid heat-rapid anneal treatment. A similar smoothing of surfaces was described in the discussion of wear above. Further applications include 'polishing' of machined parts. Precision machined parts will commonly retain machining marks on the order of 10 $\mu$m in size. Surface melting can allow the surface tension of the material to induce material reflow, smoothing the surface. Such techniques could also find application in the final polishing of diamond-turned optics, thereby totally avoiding conventional optical surface generation techniques. Finally, smooth surfaces offer fewer flaws to initiate corrosive processes. This class of surface finishing techniques will thus reduce the initial rate of corrosion significantly, beyond any changes in surface chemistry which may also be accomplished.

Having established that rapid-heat rapid-quench processes are potentially of great industrial use, one must naturally ask why they are not presently being applied in standard industrial practice. There are numerous reasons why previous laboratory-scale attempts to apply such processes failed to be accepted in the market.

Consider the conditions required to melt a thin layer (1~1 $\mu$m) of a steel surface. How much energy is required to melt the surface assuming that no thermal conduction into the bulk of the steel occurs? The melting point $T_m$ of steel is about 1530° C., the density pis ~7000 kg/m$^3$, and the specific heat c is ~3Nk where N is the number of atoms per kg (~$1.07\times10^{25}$), and Boltzmann's constant k is $1.38\times10^{-23}$ J/°K. The energy per m$^2$ in a 1 $\mu$m thick layer of molten steel is roughly $\rho c T_m \Delta 1$, or some 5600 joules per square meter. As the present interest is in industrial-scale processes, treatment of a square meter of material at a time is not unreasonable, at least for discussion.

Now the time required for quenching of this energy into the bulk of the steel must be estimated. The rate of power flow out of the molten layer is roughly $kT_m/21$ joules per square meter per second. Combining this with the earlier result, and assuming that k is not a function of temperature, $$\tau \sim \frac{c\rho l^2}{\kappa},$$

where $\tau$ us the characteristic time for the heat energy to leave the molten layer through conduction into the bulk of the steel. K is ~100 watts per meter per °K, so the characteristic time for this situation is roughly 30 nanoseconds. Note that this estimate gives a cooling rate of ~$5\times10^{10}$ °K per second, a remarkably large value compared to ~$10^6$ °K-sec$^{-1}$ for techniques such as splat quenching or planar flow casting techniques. Thicker surface layers will require longer cooling periods: for example a 10 $\mu$m melted layer on a steel body will cool at ~$5\times10^8$ °K-sec$^{-1}$, a value still associated with non-equilibrium effects.

In the primary mode of operation, the energy of the thin molten layer must be deposited in a period of time shorter than $\tau$ so that the deposited energy efficiently heats only the desired surface layer, and not the underlying material. Accordingly, the deposited power P must be greater than the energy deposited divided by the characteristic time period, or $$P>0.18 \text{ terawatts per square meter.}$$

A secondary mode of operation is also available, in which the beam energy is deposited in a thin surface layer on a time scale much longer than the characteristic thermal diffusion time for the surface layer being heated. This mode of operation is analogous to flame annealing. Such a mode is useful for annealing the surface layer, to induce grain growth or to produce a thin nanocrystalline surface layer on an amorphous material. In this mode substantial temperature increases will be experienced by much more of the material than the surface layer being directly heated, an effect which must be accounted for when carrying out the ion beam surface treatment. (A worker skilled in the art can use the equations given in this specification to predict thermal profiles (i.e., temperature increase vs. depth vs. time) for a given set of production conditions.)

Making this class of techniques even marginally practical (larger molten thickness would be desirable in most cases) requires a source unit that can deliver ~$10^4$ joules into the surface of a body in a 30–3000 nanosecond pulse. Further, unless rapid cycling (>>1 Hz) of the source is possible, the amount of material that can be treated per source unit is too small to have an impact on any but specialty items. High process efficiency is also required, as otherwise removing the waste heat from the source unit will become a difficult task, as will providing the total power required.

Consider a more definite case. The source unit is to be a pulsed laser. (The difficulties surrounding the problem of depth and consistency of power absorption will be ignored for a moment.) To get $10^4$ joules output, our 1% efficient laser will require $10^6$ joules input. To provide 10 pulses per second, a minimal speed for practical applications of this technology, the source unit must receive some 10 megawatts continuous input and have a cooling system capable of removing and disposing of nearly that much power continuously. The cost in wasted electricity alone is about $10 million dollars per year of operation. The low power efficiency of laser systems which provide short enough pulses of sufficient energy to treat large areas of a surface is clearly a problem.

Lasers present other problems when considered for this class of applications. A pulsed laser system with the required level of power has been developed for antiballistic missile systems, but the physical size and capital cost of each system is enormous. In addition, the lifetime of certain critical components is quite short (<$10^3$ pulses), requiring enormous downtime for maintenance in an industrial situation. Further, the depth of power deposition is limited to an optical skin depth. As this is much less than a micron for any suitable laser system now available acting on metals, one of two situations will develop. The total energy will be delivered suddenly to one skin depth of surface, which will then vaporize and ablate from the surface. Alternately, the energy can be slowly fed into the surface through the bottleneck presented by the requirement that the outer few nanometers of the surface not vaporize, thus requiring longer pulses with lower power. This option results in long heating periods, and substantial heating of the material underlying the desired surface heating region. Such a situation is non-optimal. Finally, in order to use a laser as a source unit for this class of manufacturing applications, the surface condition of the material presented must be carefully controlled so that the power absorption is uniform throughout the material being treated. Such control in a general industrial manufacturing environment would prove difficult.

Another possible source is an ion beam generator. Such generators are able to deposit their energy with reasonable uniformity down to depths of many microns, depending on the energy and species of the ions used, offering some promise for application to the present class of manufacturing processes.

It is important to note that the ion beam generator is not being used for ion implantation in the usual sense. There is a great deal of information on alteration of surface and near-surface regions by ion implantation, in which a rapid thermal effect is not the operative driver, but rather the gross changes in chemistry caused by implantation of the ions or the localized lattice damage resulting from slowing of individual ions. The point is that in conventional ion implantation the rate of implantation (i.e., the beam current per unit area) is of little importance as long as the ions eventually are implanted. In the present applications, the thermal effects caused by the extremely high current of ions impacting the surface are primarily responsible for the favorable surface modifications. In most cases the total dose of ions will be small enough to leave the surface composition essentially undisturbed. This point will be discussed in a more quantitative manner below.

For the moment the problem of making a suitable ion beam generator will be ignored, and attention placed on the characteristics such a generator must have to function in the modalities described above. Two problems present themselves. First, for given species of ion and target, how much beam energy is required to penetrate a given distance into the target, thus heating the target surface to that depth? Second, what total dosage is required to melt the affected area? The answers to these questions will determine the characteristics required by an ion beam generator useful for surface treatment in a manufacturing environment.

The rate as which energy is lost to electronic collisions (the primary mode of energy loss in the relevant regime) by an ion of mass $M_1$ and atomic number $Z_1$ while traversing an amorphous (or polycrystalline) target consisting of atoms of mass $M_2$ and atomic number $Z_2$ can be expressed in dimensionless units for length ($\rho$) and energy ($\epsilon$) within the LSS theory (Ion Implantation in Semiconductors, by J. W. Mayer et al., Academic Press, 1970, pgs 21–26) as $$-\frac{d\epsilon}{d\rho} = k(M_1, M_2, Z_1, Z_2)\epsilon^{1/2}.$$

The dimensionless parameters are given by $$\rho=4100dM_1/[(M_1+M_2)^2(Z_1^{2/3}-Z_2^{2/3})]R(\mu m),$$

$$\epsilon=9500M_2/[Z_1Z_2(M_1+M_2)]E(MeV),$$

and $$k=0.0793Z_1^{2/3}Z_2^{1/2}(M_1+M_2)^{3/2}/[(Z_1^{2/3}+Z_2^{2/3})^{3/4}M_1^{3/2}M_2^{1/2}].$$

In the above equations, R is distance in microns, E is the ion energy in megaelectron volts, and d is the density of the target material in grams per cubic centimeter. The energy loss equation can be solved for energy remaining after a given distance of travel in the target by substituting $\rho=\eta^2$, and integrating to find $$\epsilon(\rho)=k^2\rho^2/4-k\rho\epsilon_o+\epsilon_o,$$

where $\epsilon_o$ is the initial dimensionless energy of the ion. Given this equation, the range of an ion in the target material is found by setting $\epsilon(\rho)=0$, and solving the resulting binomial equation for the total range $\rho_t$ to give $$\rho_t=2\epsilon_o^{1/2}/k.$$

Both theory and experiment agree that the energy of the ions is distributed relatively uniformly throughout a volume starting at the surface and proceeding ~$\rho_t$ inward.

To give a feel for the above equations, consider a specific example. Carbon ions (Z=6, M=12) having an energy of 1

MeV are incident on an iron (Z=26, M56) surface. The dimensionless energy $\epsilon$ is equal to 50 E(MeV), the dimensionless range $\rho$ is equal to 6.2 R/($\mu$m), and k=0.37. (All numerical values are approximate.) By the above range equation, $\rho_r=2\times50^{1/2}/0.37=38.2$. Solving for the actual distance $R_t(\mu m)=\rho/6.2=38.2/6.2=6.2$ $\mu$m range. The energy distance relationship calculated here is by no means universal, but serves to illustrate that when thermal heating of a surface layer having a thickness of several microns is desired, the ion energy required to likely to be on the order of 1 MeV.

The question of the total dosage required to melt a surface layer can now be illustrated. Continuing with the above example, the earlier estimate that 5600 J/m$^2$ is required to melt a 1 $\mu$m layer of steel shows that some 3500 J/m$^2$ is required to be deposited to melt the 6.2 $\mu$m surface layer heated by a 1 MeV carbon beam. This amount of energy is also equal to $2.2\times10^{17}$ MeV. The process of melting the 6.2 $\mu$m surface layer thus requires an addition of carbon ions amounting to about 2% of a monolayer. The affected region is some $10^4$ S of monolayers thick, so in this example the contamination of the surface layers by carbon is on the order of 1 part in $10^6$, an amount negligible to the chemistry of most surface modification processes. This demonstrates that the effect of high energy pulsed ion beams is due almost totally to thermal heating of the surface layers, a process made very different from ion implantation by the time scales involved.

Finally, the beam current required can be estimated. A pulse of 1 MeV carbon ions must consist of $2.2\times10^{17}$ ions if a square meter is to be treated in a single pulse. This amount of ions must be transmitted in no more than a few hundred nanoseconds. (The timescale is longer because of the increased thickness of the melted zone.) The resulting rate is about $10^{25}$ ions/sec, representing a current of about 1.6 megaamperes. The pulse must therefore carry a power of some 1.6 terawatts per square meter of surface treated. The size of this number explains why so few experimental studies of surface modification using the thermal effects of ion beam treatment have been made.

Given that the use of ion beam generators for surface modification can be carried out as described above, why is there currently so little penetration of commercial markets? The use of ion beams for thermally altering the near surface characteristics of a material has been fraught with substantial problems. Most notable of the limitations with existing ion beam technologies have been: 1) high costs per area treated; 2) the inability to generate a large number of pulses without the costly replacement of ion beam generator components; 3) low repetition rates; 4) low average power; and 5) the inability to reliably produce a uniform ion beam of a single selectable ion species.

Typical ion beam generators use dielectric surface arcing on an anode as a source of ions and thereafter magnetically or geometrically direct and focus the generated ion beam onto the material of interest. This surface arcing (also called "flashover") destroys the anode surface in less than 100 pulses, and produces a mixed species of ions that cannot be adjusted. Other difficulties arising from flashover include: production of large quantities of neutral gas that makes high repetition rate difficult, generation of debris which can contaminate surfaces being treated, and non-uniformity and irreproducibility of the beam in some cases due to the localized and difficult to control nature of flashover.

State-of-the-art ion beam generators are typically "one shot" devices, i.e., they operate at low repetition rate (<<1 Hz). Existing ion beam generators cannot be operated at high repetition rates (<<1 Hz) for a number of reasons. First, existing pulsed power supplies are no able to generate electrical pulses at high repetition rates having the voltage, pulse width (i.e., normal temporal duration), and power required to generate the ion beams needed (i.e., consistent with the discussion above) for the various beneficial applications described herein. This limitation renders commercial exploitation impractical. Second, the design of existing ion beam generators does not allow repetitive operation for an extended number of operating cycles ($<<10^3$) without replacement of major components. This limitation would require a maintenance time—manufacturing time ratio incompatible with routine manufacturing operations. Fourth, existing ion beam generators generally operate with electrical efficiencies<5%, thus presenting major challenges to the pulsed power supply and the cooling system of the generator. These limitations and others have made it impossible to routinely utilize the ion beam technology described above for surface treating materials.

The present invention generates high energy, repetitive ion beams which overcome the limitations of existing ion beam generators and provides a cost-effective processing technology for thermally altering the near surface characteristics of materials.

SUMMARY OF THE INVENTION

The present invention provides a system for generating a high energy, pulsed ion beam repetitively over an extended number of operating cycles. In particular, the present invention provides an ion beam generator capable of repetitive operation over an extended operating cycle suitable for thermally treating large surface areas of a material at low cost. This ion beam generator comprises a high voltage, high current pulsed power system and a pulsed ion beam source, both capable of high repetition rates and both having the capability for an extended operating life.

This new technology enables the cost effective, commercial scale use of ion beam surface treatment. High energy, repetitively pulsed ions beams produced according to the present invention can produce surface treatments ranging from high temperature anneals through melting to ablation, followed by rapid thermal quenching to ambient temperatures. The control variables for the ion beam treatment include ion species, kinetic energy of the ions, temporal width of the ion pulses, and total dose of ions (which total dose may be delivered in a number of discrete pulses). Variation of these parameters allows uniform heating, to a desired temperature, of a surface region of any material whose thickness approximately corresponds to the range of the ions used in the material being heated.

The present invention enables a commercially practical method allowing surface treatment of a material for numerous purposes described herein using pulsed ion beams, comprising the steps of: generating a repetitively pulsed ion beam; and irradiating a surface of the material with the repetitively pulsed ion beam to heat said surface to a predetermined degree to a predetermined depth, wherein the pulsed ion beam has a duration less than about 1 $\mu$s and beam energy greater than or equal to 0.05 MeV.

Further detail concerning the makeup of the present invention and its scope of applicability will become apparent from the detailed discussion of specific embodiments presented below. However, it should be understood that the detailed description and specific examples, while representing the class of embodiments of the invention and its uses, are given by way of illustration only since various changes and modifications within the spirit and scope of the invention will be apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

The following discussion will begin with a description of the system utilized to produce the ion beams. This system has two major subsystems, the pulsed power source and the ion diode. The discussion will then continue with descriptions of a number of examples of ion beam treatments to various materials.

The present invention provides an ion beam generator capable of high average power and repetitive operation over an extended number of operating cycles for treating large surface areas of materials at commercially attractive costs. In particular, the ion beam generator of the present invention can produce high average power (1 kW–4 MW) pulsed ion beams at 0.1–2.5 MeV energies and pulse durations or lengths of from about 10 nanoseconds (ns)–2 microseconds ($\mu$s) or longer as necessary for the particular application. The ion beam generator can directly deposit energy in the top 50 micrometers ($\mu$m) of the surface of a material. The depth of treatment can be controlled by varying the ion energy and species as well as the pulse length.

Figure 1:
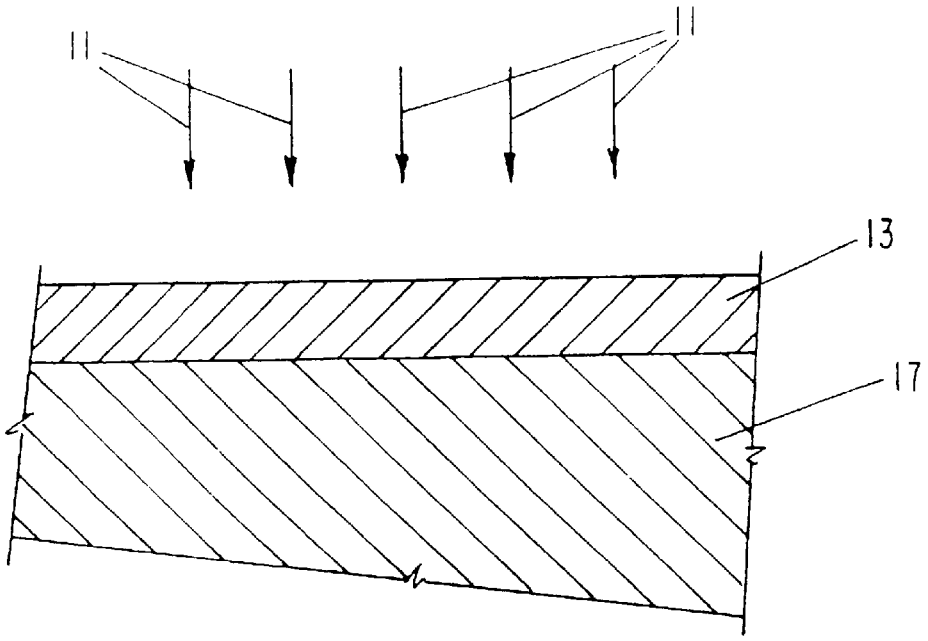
FIG. 1 schematically depicts the process of this invention by which deposition of a pulse of ion beam energy into a near surface layer almost instantly raises the local temperature above the melting point with extremely rapid thermal diffusion of the heat into the underlying substrate.
Figure 2:
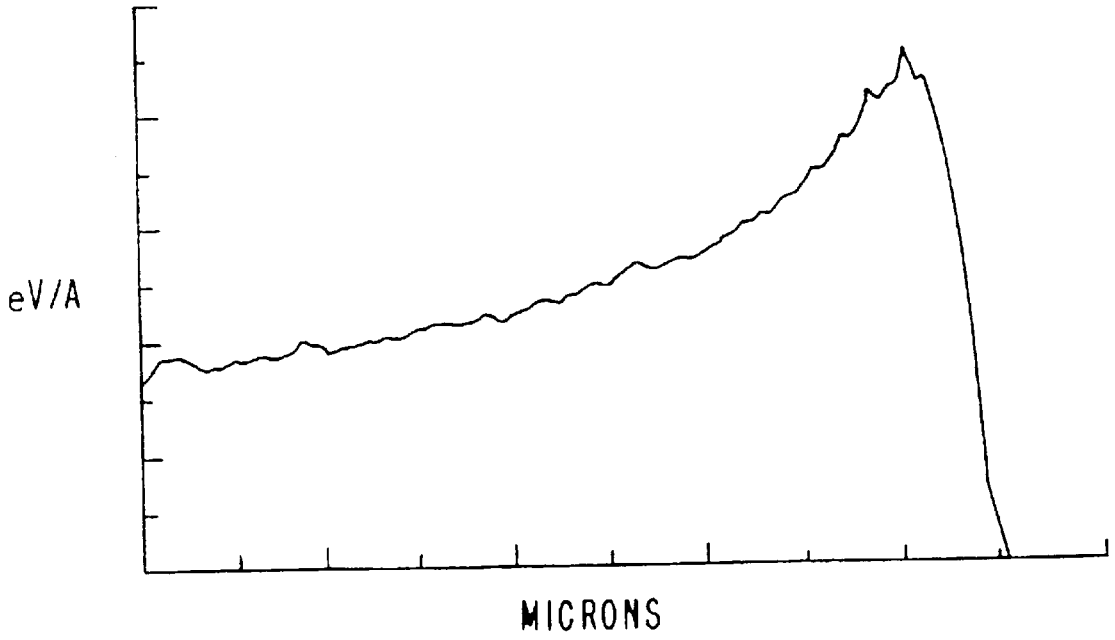
FIG. 2 graphically depicts the in-depth deposition of energy for a 900 keV proton beam.

FIG. 1 schematically illustrates irradiating a material with ion beams in accordance with the principles of the present invention. Although this process can be used to implant ions to the extent that the chemical composition of the implanted region is altered, normally the process will be utilized to deposit energy into the top surface of the material and will not significantly change the atomic composition of the material. As such the process will either heat or ablate the near surface using typically $3\times10^{13}$ ions/cm$^2$ per pulse. Such a dose will represent only approximately $10^{-5}$–$10^{-3}$ atomic percent of the sample density. Deposition of ion beam energy 11 in a thin near surface layer 13 causes melting of the layer with relatively small energies (typically 1–10 J/cm$^2$) and allows rapid cooling of the melted layer by thermal diffusion into the underlying substrate 17 as depicted in FIG. 1. FIG. 2 is a graph which represents the effects whereby, when high energy ions come to rest in a material, the energy is deposited preferentially near the end of the range of penetration into the material. FIG. 2 is a graph showing the so-called Bragg peak for a 0.9 MeV proton beam, plotting electron volts per Angstrom as a function of depth in microns.

Figure 5A:
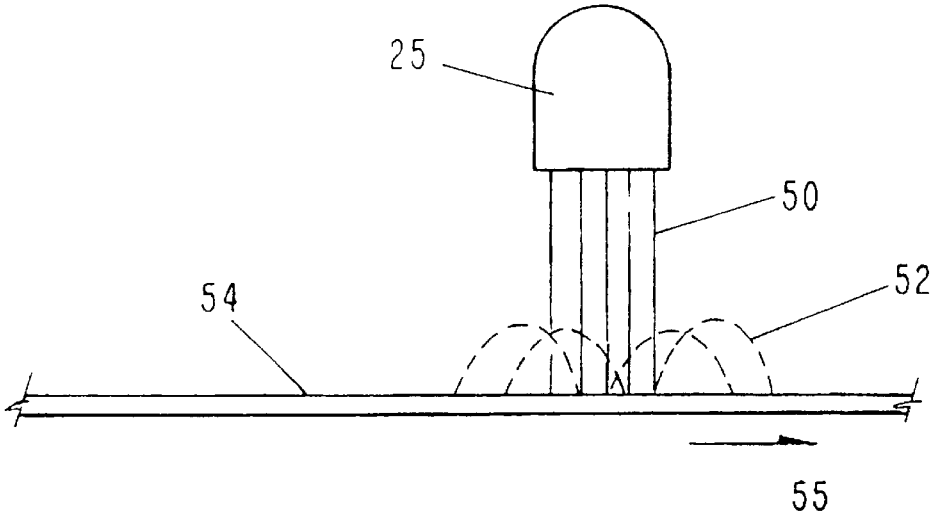
FIG. 5A is a schematic diagram of a process by which material ablated from a first material surface is redeposited onto that surface.
Figure 5B:
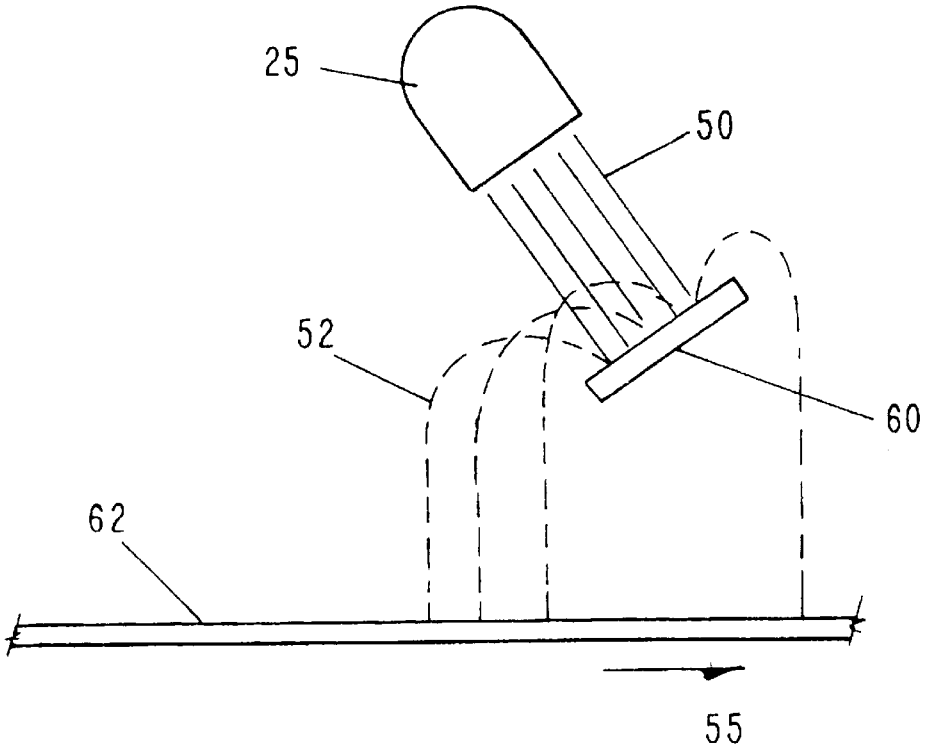
FIG. 5B is a schematic diagram of a process by which material ablated from a first material surface is redeposited onto a second material surface.

At higher energy intensities ($\geqq$10–20 J/cm$^2$), this process can cause rapid ablation of the substrate. This in turn can be used to deposit a polycrystalline or nanocrystalline layer onto another substrate or to redeposit such a layer on the original substrate. This is shown schematically in FIGS. 5A and 5B which depict rapid ablation and redeposition onto the same material specimen and rapid ablation from one material surface with deposition onto a second material surface, respectively. FIG. 5A shows a production process with the material 54 moving from left to right as indicated by the arrow 55. Ions 50 from the ion beam source 25 ablate the material 54 to form particles 52 which rise above the material 54 and then redeposit back onto the material 54. In FIG. 5B the high energy ions 50 from the ion beam source 25 ablate the first material 60 creating ablated particles 52 which then fall onto the second material 62 which is moving in the direction of the arrow 55. Of course, either ablation process could also be conducted on stationary materials. These higher intensity pulses can also be used to induce shock hardening of much deeper regions of the irradiated substrate.

The relatively small energy densities needed for treatment together with the high instantaneous powers available using the present invention allow large surface areas (50 to more than 1000 cm$^2$) to be treated with a single ion beam pulse, greatly reducing or eliminating the portions of the treated material which are subject to edge effects at the transition between treated and untreated areas. The relatively short ion beam pulse lengths, preferably $\leqq$200 ns for use with metals, developed by the ion beam generator limit the depth of thermal diffusion, thus allowing the treated/melted region to be localized to a selected depth.

Typical cooling rates of the present invention ($10^8$–$10^{10}$ K/sec) are sufficient to cause amorphous layer formation in some materials, fine grain structures in some materials, the production of non-equilibrium microstructures (nanocrystalline and metastable phases), and the formation of new alloys by rapid quenching and/or liquid phase mixing of layers of different materials. Such rapid thermal quenching ($>10^8$K/sec) can significantly improve smoothness, corrosion, wear and hardness properties of the treated near surface layer. The ion beam generator of the present invention is composed of two major components: a high energy, pulsed power system (shown in FIG. 3) and an ion beam source 25 (shown in FIG. 4), both capable of high repetition rates and both having extended operating lives.

The Pulsed Power Source

The first of these components is a compact, electrically efficient, repetitively pulsed, magnetically switched, pulsed power system capable of $10^9$ pulse operating cycles aof the type described by H. C. Harjes, et al. Pro 8th IEEE Int. Pulsed Power Conference (1991), and D. L. Johnson et al., "Results of Initial Testing of the Four Stage RHEPP Accelator" pp. 437–440 and C. Harjes et al., "Characterization of the RHEPP 1 $\mu$s Magnetic Pulse Compression Module", pp. 787–790, both reprinted in the Digest of Technical Papers of the Ninth IEEE International Pulsed Power Conference, June, 1993, all of which is incorporated by reference herein. These references in conjunction with the discussion herein below place fabrication of such a pulsed power source within the skill of the art.

Figure 3:
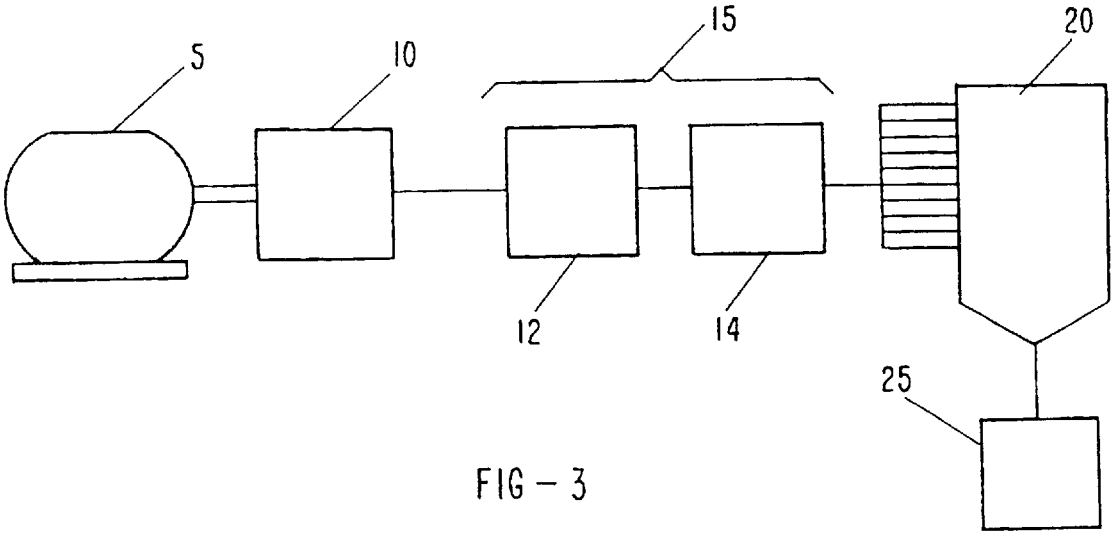
FIG. 3 is a schematic of the pulsed power system of the present invention.

A block diagram of a power system produced according to the teachings of the present application is shown in FIG. 3. From the prime power input, several stages of magnetic pulse compression and voltage addition are used to deliver a pulsed power signal of up to 2.5 MV, 60 ns FWHM, 2.9 kJ pulses at a rate of 120 Hz to an ion beam source for this particular system. The power system converts AC power from the local power grid into a form that can be used by an ion beam source 25.

Referring to FIG. 3, in one embodiment of the invention, the power system comprises a motor 5 which drives an alternator 10. The alternator 10 delivers a signal to a pulse compression system 15 which has two subsystems, a 1 $\mu$s pulse compressor 12 and a pulse forming line 14. The pulse compression system 15 provides pulses to a linear inductive voltage adder (LIVA) 20 which delivers the pulses to the ion beam source 25.

The alternator 10 according to one embodiment is a 600 kW, 120 Hz alternator. In the unipolar mode, it provides 210 A rms at a voltage of 3200 V rms with a power factor of 0.88 to the magnetic switch pulse compressor system 15. The alternator is driven by a motor connected to the local 480V power grid. The particular alternator used herein was designed by Westinghouse Corporation and fabricated at the Sandia National Laboratories in Albuquerque, N.M. It is described in detail in a paper by R. M. Caifo et al., "Design and Test of a Continuous Duty Pulsed AC Generator" in the Proceedings of the 8th IEEE Pulsed Power Conference, pp. 715–718, June, 1991, San Diego, Calif. This reference is incorporated herein in its entirety. This particular power system was selected and built because of its relative ease in adaptability to a variety of loads. Other power sources may be used and may indeed be better optimized to this particular use. For example, a power supply of the type available for Magna-Amp, Inc. comprising a series of step-up transformers connected to the local power grid feeding through a suitably-sized rectifier could be used. The present system however has been built and performs reasonably well.

In one embodiment, the pulse compression system 15 is separated into two subsystems, one of which is a common magnetic pulse compressor 12 composed of a plurality of stages of magnetic switches (i.e., saturable reactors) the operation of which is well known to those skilled in the art. This subsystem is shown in more detail in FIG. 3A. The basic operation of each of the stages is to compress the time width (transfer time) of and to increase the amplitude of the voltage pulse received from the preceeding stage. Since these are very low loss switches, relatively little of the power is wasted as heat, and the energy in each pulse decreases relatively little as it moves from stage to stage. The specific subsystem used herein is described in detail by H. C. Harjes, et al., "Characterization of the RHEPP 1 $\mu$s Magnetic Pulse Compression Module", 9th IEEE International Pulsed Power Conference, pp. 787–790, Albuquerque, N.M., June, 1993. This paper is incorporated by reference herein in its entirety. These stages as developed for this system are quite large. In the interest of conserving space, it would be possible to replace the first few stages with appropriately designed silicon control rectifiers (SCR's) to accomplish the same pulse compression result.

These stages 12 convert the output of the alternator 10 into a 1 $\mu$s wide LC charge waveform which is then delivered to a second subsystem 14 comprising a pulse forming line (PFL) element set up in a voltage doubling Blumlein configuration. The PFL is a triaxial water insulated line that converts the input LC charge waveform to a flat-top trapezoidal pulse with a design 15 ns rise/fall time and a 60 ns FWHM. The construction and operation of this element is described in detail by D. L. Johnson et al. "Results of Initial Testing of the Four Stage RHEPP Accelerator", 9th IEEE International Pulsed Power Conference, pp. 427–440, Albuquerque, N.M., June, 1993. This paper is also incorporated by reference in its entirety. A cross sectional view of the PFL is shown in FIG. 3B.

Figure 3A:
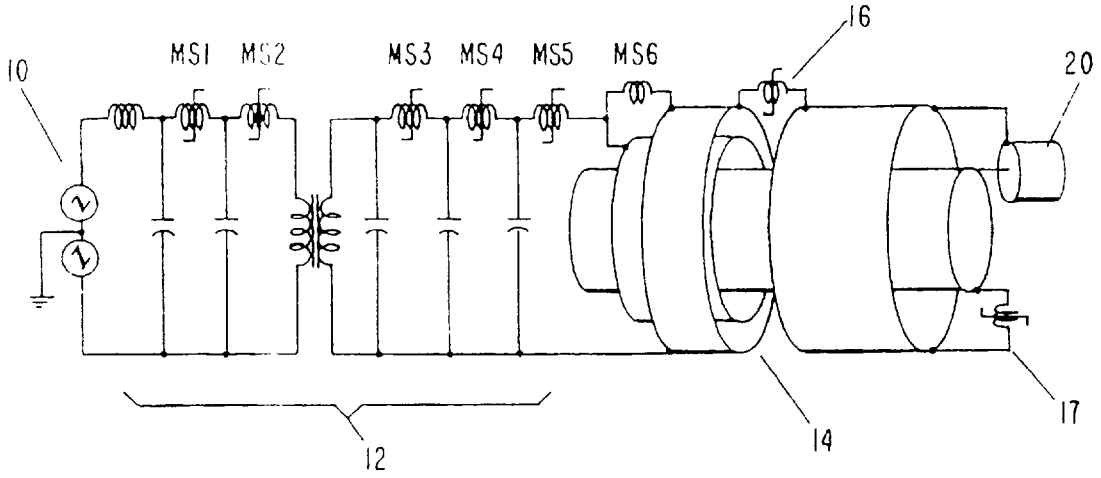
FIG. 3A is a circuit diagram of a pulse compression system 15 utilized in the pulsed power system of FIG. 3.

The pulse compression system 15 can provide unipolar, 250 kV, 15 ns rise time, 60 ns full width half maximum (FWHM), 4 kJ pulses, at a rate of 120 Hz, to the linear inductive voltage adder (LIVA) (20). In a preferred embodiment, the pulse compression system 15 should desirably have an efficiency >80% and be compressed of high reliability components with very long lifetimes ($\sim 10^9$–$10^{10}$ pulses). Magnetic switches are preferably used in all of the pulse compression stages, MS1–MS5, because they can handle very high peak powers (i.e., high voltages and currents), and because they are basically solid state devices with a long service life. The five compression stages used in this embodiment as well as the PFL 14 are shown in FIG. 3A. The power is supplied to the pulse compression system 15 from the alternator 10 and is passed through the magnetic switches, MS1–MS5, to the PFL 14. The PFL is connected to the linear induction voltage adder (LIVA) 20 described below. The second and third magnetic switches, MS2 and MS3, are separated by a step-up transformer T1 as shown. Switch MS6 is an inversion switch for the PFL.

Figure 3B:
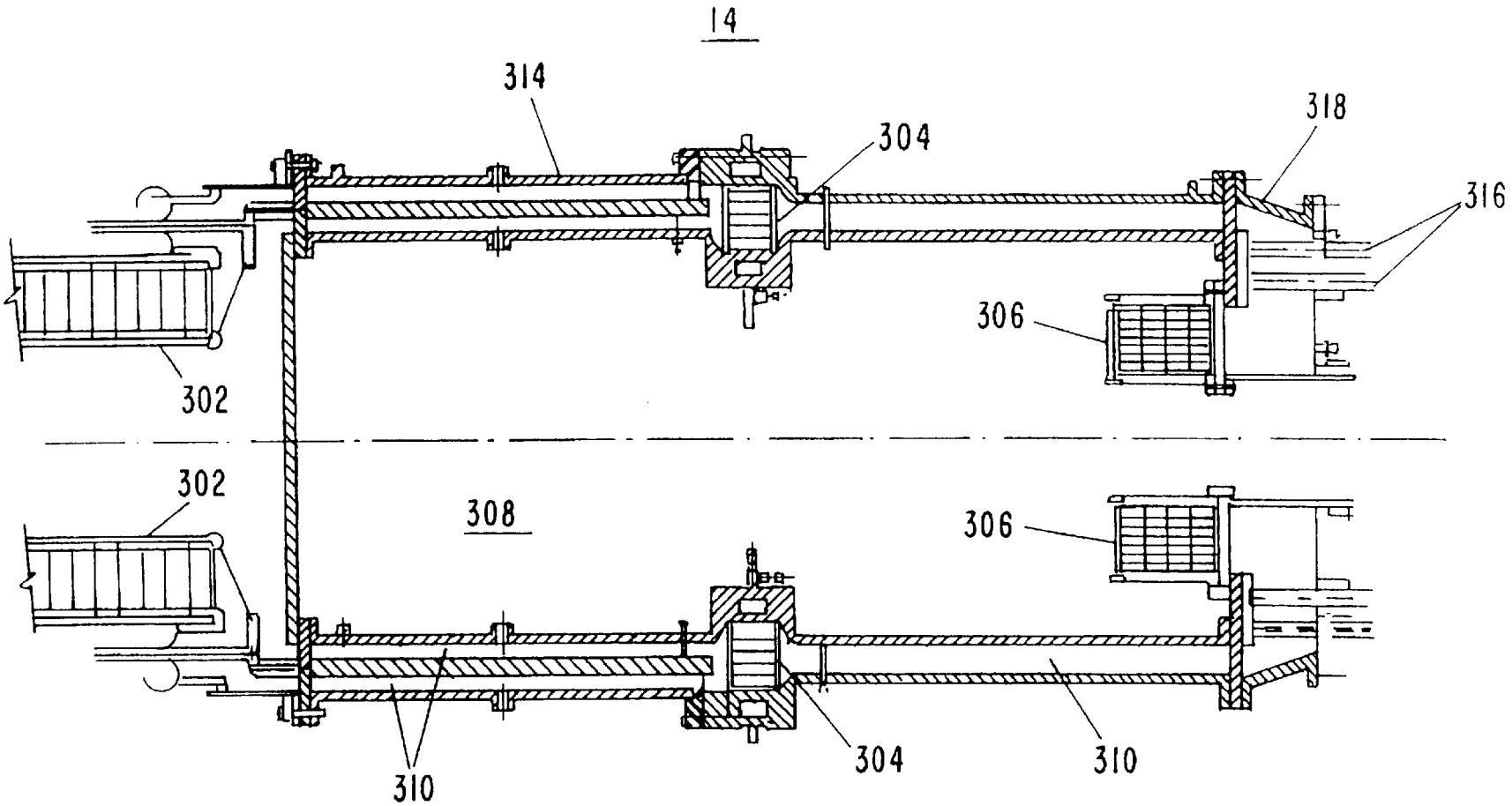
FIG. 3B is a cross sectional view of a pulse forming line element.

The pulse forming line (PLF) element 14 is shown in schematically in FIG. 3A and in cross section in FIG. 3B. MS6 in FIG. 3A corresponds to the inversion switch 302 shown in FIG. 3B located on the input side of the tri-axial section 314 of the PFL. Output switches 304 and charging cores 306 are also shown. The regions 310 are filled with deionized water as the dielectric. The interior region 308 is filled with air and oil cooling lines, not shown, for the output switches 304. The output of the PFL is fed in parallel to each of the individual LIVA stages 20, with the positive component flowing through conductors 316 and the shell 318 of the PFL serving as ground. The positive conductors 316 are connected to each of the LIVA stages.

Figure 3C:
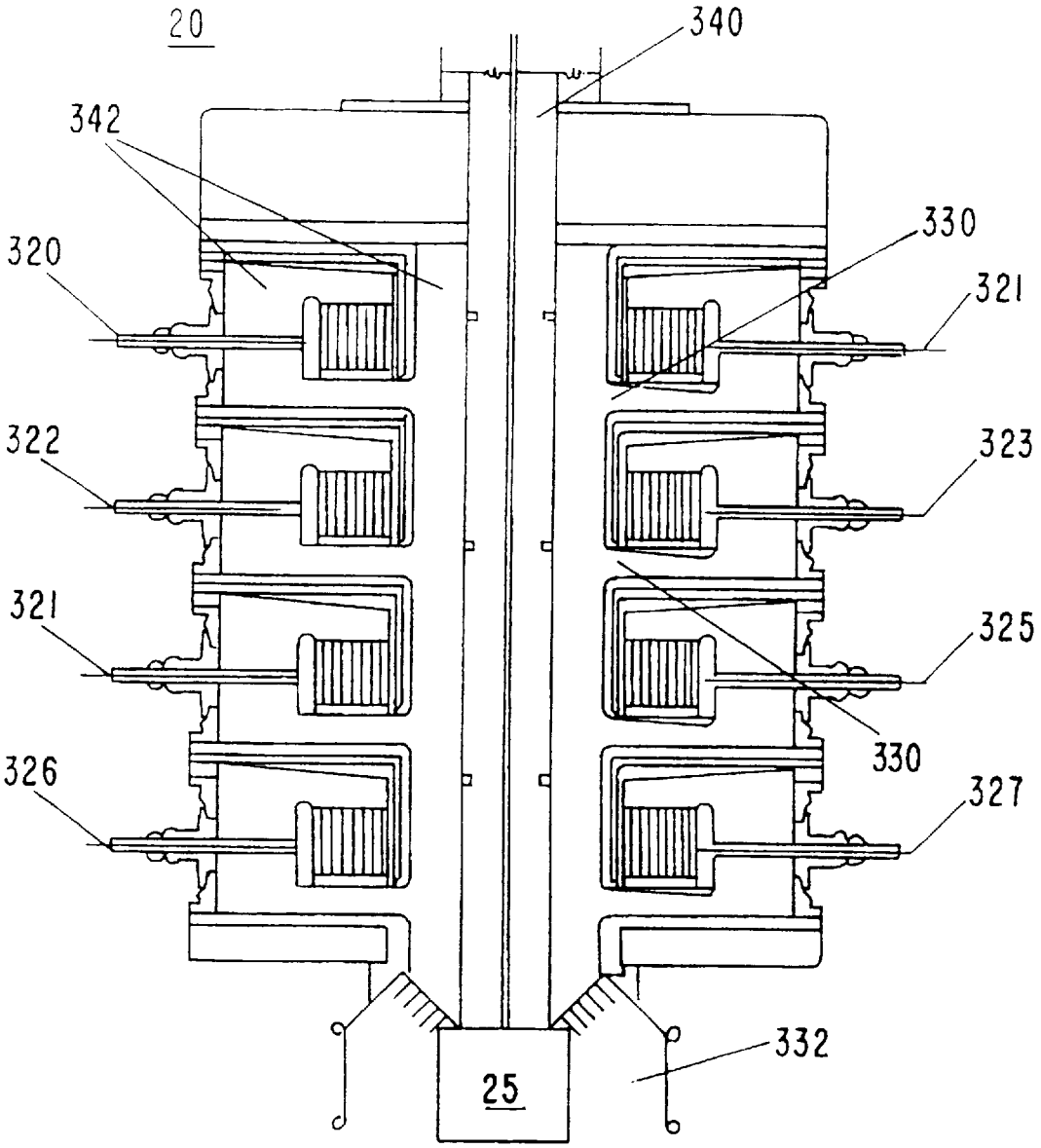
FIG. 3C is a cross sectional view of the Linear Inductive Voltage Adder (LIVA)

The LIVA (20) is preferably liquid dielectric insulated. It is connected to the output of the PFL and can be configured in different numbers of stages to achieve the desired voltage for delivery to the ion beam source. The LIVA 20 can deliver nominal 2.5 MV, 2.9 kJ, pulses at a rate of 120 Hz to the ion beam source 25 when configured with 10 stages of 250 kV each. For most of the ion beam treatments, the LIVA was configured with four stages of 250 kV each, such that the LIVA delivered a total of 1.0 MV to the ion beam source. However, this voltage can be increased or decreased by changing the number of stages in the LIVA to match the particular material processing need. This nominal output pulse of the LIVA 20 is the same as the provided to it by the PFL, namely, trapezoidal with 15 ns rise and fall times and 60 ns FWHM. FIG. 3C shows a cross section of the four stage LIVA. The four stages, 320, 322, 324, and 326, are stacked as shown and fed the positive pulses from the PFL via the cables 321, 323, 325, and 327. The stages are separated by gaps 330 and surrounded by transformer oil for cooling. The output from each of the LIVA stages adds to deliver a single total pulse to the ion beam source shown here schematically as 25 which is located within a vacuum chamber 332, shown in partial view. As with the PFL, the outside shell of the LIVA is connected to ground.

The power system P (FIG. 3) as described, can operate continuously at a pulse repetition rate of 120 Hz delivering up to 2.5 kJ of energy per pulse in 60 ns pulses. The specific power system described here can deliver pulsed power signals of about 20–1000 ns duration with ion beam energies of 0.25 . 2.5 MeV. The power system can operate at 50% electrical efficiency from the wall plug to energy delivered to a matched load. The power system P uses low loss pulse compression stages incorporating, for example, low loss magnetic material and solid state components, to convert AC power to short, high voltage pulses.

The ability to produce voltages from 250 kV to several MV by stacking voltage using a plurality of inductive address incorporating low loss magnetic material is a principle feature when high voltages are needed, although it is also possible to use a single stage pulse supply, eliminating the need for the adder.

The power system can operate at relatively low impedances (<100Ω) which also sets it apart from many other repetitive, power supply technologies, such as transformer-based systems. This feature allows high treatment rates and the treatment of large areas (5 to more than 1000 $cm^2$) with a single pulse so as to reduce edge effects occurring at the transition between treated and untreated areas.

The Ion Diode

Figure 4:
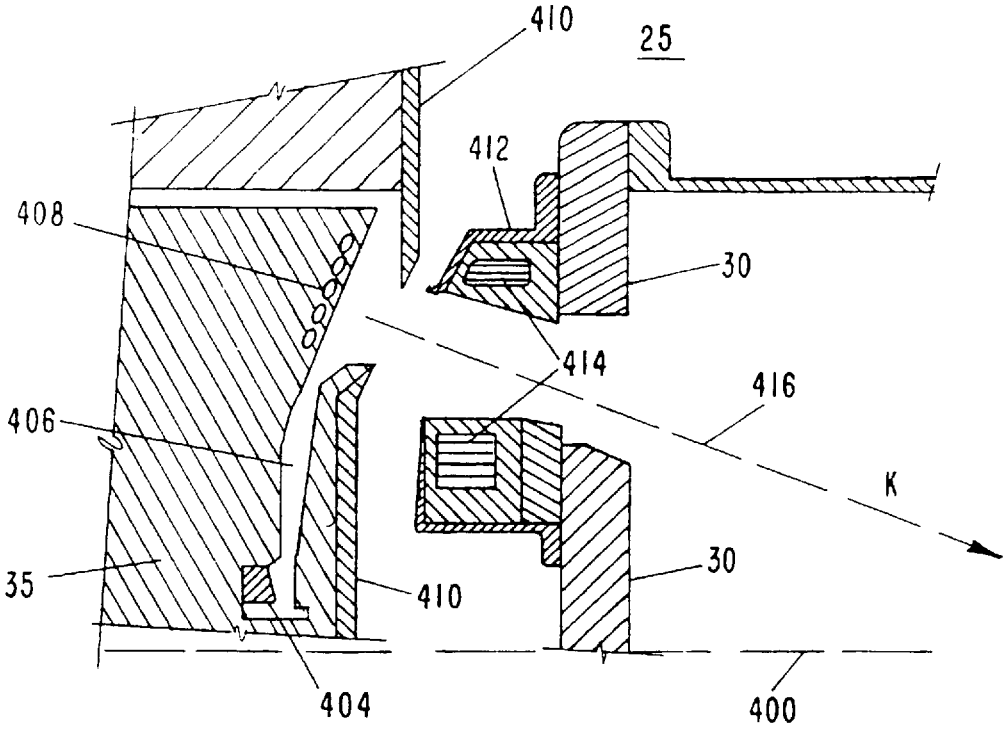
FIG. 4 is a partial cross sectional view of an ion beam or a magnetically-confined anode plasma (MAP) source 25 of the FIG. 3 system according to the principles of the present invention.

The second component of the present invention is an ion beam source 25 (shown in FIG. 4). The ion beam source is capable of operating repetitively and efficiently to utilize the pulsed power signal from the power system efficiently to turn gas phase molecules into a high energy pulsed ion beam. A precursor of the ion beam source is an ion diode described generally by J. B. Greenly et al, "Plasma Anode Ion Diode Research at Cornell: Repetitive Pulse and 0.1 TW Single Pulse Experiments", Proceedings of 8th Intl. Conf. on High Power Particle Beams (1990) all of which is incorporated by reference herein. Although this reference ion diode differs significantly from the ion diode utilized in the present system, the background discussion in this reference is of interest.

Figure 4A:
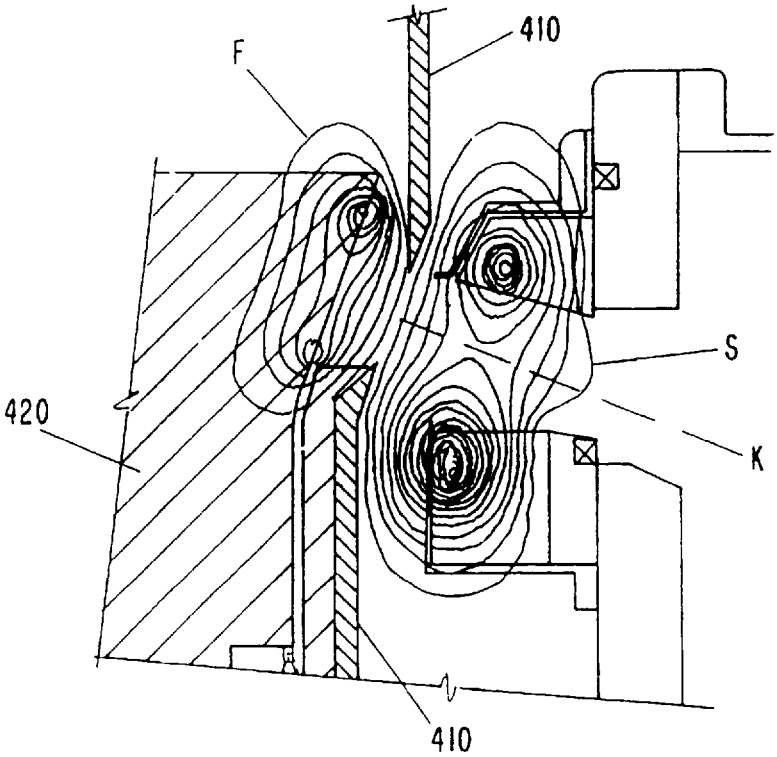
FIG. 4A is a modified version of FIG. 4 showing the magnetic field lines produced by the fast and slow coils in the MAP source.

An ion beam source 25, according to the principles of the present invention, is shown in FIG. 4. The ion beam source 25 is preferably a magnetically-confined anode plasma (MAP) source. FIG. 4 is a partially cross-sectional view of one symmetric side of the ion beam or MAP source 25. The ion beam or MAP source 25 produces an annular ion beam K which can be brought to a broad focus symmetric about the axis X—X 400 shown. In the cathode electrode assembly 30 slow (1 ms rise time) magnetic field coils 414 produce magnetic flux S (as shown in FIG. 4A) which provides the magnetic insulation of the accelerating gap between the cathodes 412 and the anodes 410. The anode electrodes 410 also act as magnetic flux shapes. The slow coils 414 are cooled by adjacent water lines, not shown, incorporated into the structure supporting the cathodes 412 and the slow coils 414. The main portion of the MAP structure shown in this Figure is about 18 cm high and wide.

The ion beam or MAP source 25 operates in the following fashion: a fast gas valve assembly 404 located in the anode assembly 35 produces a rapid (200 [ms] $\mu s$) gas puff which is delivered through a supersonic nozzle 406 to produce a highly localized volume of gas directly in front of the surface of a fast driving coil 408 located in an insulating structure 420. After pre-ionizing the gas with a 1 [ms] $\mu s$ induced electric field, the fast driving coil 408 is fully energized, inducing a loop voltage of 20 kV on the gas volume, driving a breakdown to full ionization, and moving the resulting plasma toward the flux filled shaping anode electrodes 410 in about 1.5 [ms] $\mu s$ to form a thin magnetically-confined plasma layer. The pre-ionization step is a departure from the earlier MAP reference which showed a separate conductor located on the face of a surface corresponding to the insulating structure 420 herein. Since this conductor was exposed to the plasma, it broke down frequently. One of the inventors herein discovered that the separate pre-ionizing structure was unnecessary. The gas can be effectively pre-ionized by placing a small ringing capacitor in parallel with the fast coil. The field oscillators produced by this ringing circuit pre-ionize the gas in front of the anode fast coil.

We have also discovered that, prior to provision of the main pulse to the fast coil, it is beneficial to have the ability to adjust the configuration of the magnetic field in the gap between the fast coil and the anode to adjust the initial position of plasma formation in the puffed gas pulse prior to the pre-ionization step. This is accomplished by the provision of a slow bias capacitor and a protection circuit both being installed in parallel with the fast coil and isolated therefrom by a controllable switch. A slow bias field is thus created prior to pre-ionization of the gas by the fast coil.

After pre-ionization the fast coil is then fully energized as described above to completely breakdown the gas into the plasma. After this pulse the field collapses back into the fast coil which is connected to a resistive load which is in turn connected to a heat sink, not shown. In this manner heat build up in the fast coil is avoided.

The fast coils 408 have been redesigned from the reference fast coils in several ways as well as the heat sinking mentioned above. The gap between the fast coil and the anode electrodes 410 has been reduced with the result that the amount of necessary magnetic energy has been decreased by over 50%. The lower energy requirement permits repetitive use at higher frequencies and reduces the complexity of the feed system voltages for the fast coils. The design of the new flux-shaping anode electrode assembly has also contributed to these beneficial results.

The pulsed power signal from the power system is then applied to the anode assembly 35, accelerating ions from the plasma to form an ion beam K. The slow (S) and fast (F) magnetic flux structures, at the time of ion beam extraction, are shown in FIG. 4A. The definite separation between the flux from the fast coil from the flux from the slow coil is shown therein. This is accomplished by the flux-shaping effects of the anodes 410 and also by the absence of a slow coil located in the insulating structure 420 as was taught in the earlier MAP reference paper. The slow coils in the present system are located only in the cathode area of the MAP. This anode flux shaping in conjunction with the location of slow coils in the cathode assembly is different from that shown in the MAP reference paper and permits the high repetition rate, sustained operation of the MAP diode disclosed herein. This design allows the B=0 point (the separatrix) to be positioned near the anode surface, resulting in an extracted ion beam with minimal rotation. This minimal rotation is necessary for effective delivery of the beam to the material to be treated.

Figure 4B:
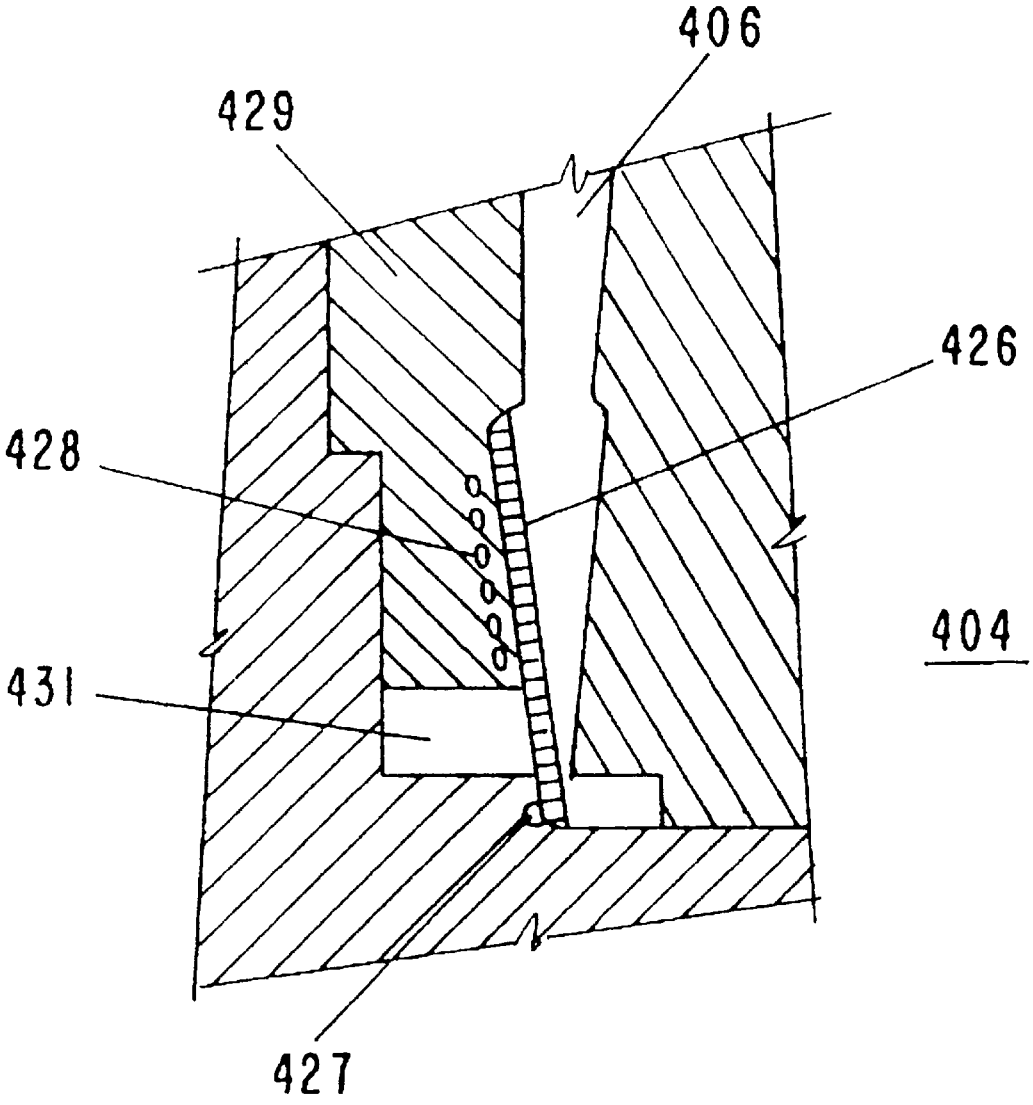
FIG. 4B is an expanded view of a portion of FIG. 4 showing the gas inlet valve and the gas inlet channel.

FIG. 4B is a detailed view of the gas valve assembly 404 and the passage 425 which conducts the gas from the valve 404 to the area in front of the fast coil 408. The passage 425 has been carefully designed to deposit the gas in the localized area of the fast coil with a minimum of blow-by past this region. The gas valve flapper 426 is operated by a small magnetic coil 428 which opens and closes the flapper 426 upon actuation from the MAP control system. The flapper valve is pivoted on the bottom end 427 of the flapper. The coil 428 is mounted in a high thermal conductivity ceramic support structure 429 which is in turn heat sinked to other structure, not shown. This heat sinking is necessary for the sustained operating capability of the MAP. The gas is delivered to the valve from a plenum 431 behind the base of the flapper. The vacuum in the nozzle 406 rapidly draws the gas into the MAP once the flapper 426 is opened. The function of the nozzle is to produce a directed flow of gas only in the direction of flow and not transverse to it. Such transverse flow would direct gas into the gap between the anode and the cathode which would produce detrimental arcing and other effects. The reduction of the fast coil-anode gap discussed above makes the design of the nozzle very important to the successful operation of the MAP. Fortunately, gas flow design tools are available and were used to develop a nozzle with improved gas flow (higher mach number) and minimal boundary effects. This improved nozzle has an enlarged opening into the gas between the fast coil and the near edge of the anode which tapers from 9 to 15 mm instead of the straight walled 6 mm conduit in the reference MAP. The operating pressure of the gas in the puff valve has been increased from the range of 5–25 psig to the range of 35–40 psig. Experiments have confirmed much improved MAP operation as a result of this new design.

The ion diode of this invention is distinguished from prior art ion diodes in several ways. Due to its low gas load per pulse, the vacuum recovery within the MAP allows sustained operation up to and above 100 Hz. As discussed above, the magnetic geometric is fundamentally different from previous ion diodes. Prior diodes produced rotating beams that were intended for applications in which the ion beam propagates in a strong axial magnetic field after being generated in the diode. The present system requires that the ion beam be extracted from the diode to propagate in field-free space a minimum distance of 20–30 cm to a material surface. The magnetic configurations of previous ion diodes are incapable of this type of operation because those ion beams were forced by the geometries of those diodes to cross net magnetic flux and thus rotate. Such beams would rapidly disperse and be useless for the present purposes. By moving the slow coils (the diode insulating magnetic field coils) to the cathode side of the diode gap eliminated the magnetic field crossing for the beam but required a total redesign of the magnetic system for the anode plasma source. The modifications to the fast coil discussed above result in an energy requirement that is 5–10 times less than previous configurations. The modifications include: the elimination of a slow coil on the anode side of the diode and its associated feeds, better control over the magnetic field shaping and contact of the anode plasma to the anode electrode structure through the use of the partially field-penetrable electrodes, the elimination of the separate pre-ionizer coil from the prior ion diodes, the circuit associated with the fast coil to provide "bias" current to adjust the magnetic field to place the anode plasma surface on the correct flux surface to eliminate beam rotation and allow optimal propagation and focusing of the beam, and the redesign of the gas nozzle to better localize the gas puff which enable the fast coil to be located close to the diode gap which in turn reduces the energy requirements and complexity of the fast coil driver.

The plasma can be formed using a variety of gas phase molecules. The system can use any gas (including hydrogen, helium, oxygen, nitrogen fluorine, neon, chlorine and argon) or vaporizable liquid or metal (including lithium, beryllium, boron, carbon, sodium, magnesium, aluminum, silicon, phosphorous, sulfur, and potassium) to produce a pure source of ions without consuming or damaging any component other than the gas supplied to the source. The ion beam K propagates 20–30 cm in vacuum ($\sim 10^{-3}$) to a broad focal area (up to 1000 $cm^2$) at the target plane, not shown, where material samples are placed for treatment and can thermally alter areas from 5 $cm^2$ to over 1000 $cm^2$.

The ion beam or MAP source 25 is capable of operating at repetitive pulse rates of 100 Hz continuously with long component lifetimes $>10^6$. The ion beam or MAP source 25, according to the principles of the present invention, draws ions from a plasma anode rather than a solid dielectric surface flashover anode used in present single pulse ion beam sources. Use of a flashover anode typically introduces a variety of contaminants to the surface of the material, often with detrimental results. One of the significant advantages of the using the improved MAP source disclosed herein is that one has precise control over the components in the ion beam by controlling the composition of the gas source.

The present invention combines the pulsed power supply P and the MAP ion source 25 to obtain a system for repetitively generating pulsed high voltage ion beams in a manner that allows the use of this technology for the efficient treatment of surfaces in commercial applications. In particular, the ion voltage is in the range 0.1–2.5 MeV per ion, the energy per pulse is as large as 2.5 kJ, and the ion source impedance is significantly less than 100Ω, allowing the pulse width to be as small as 30 ns. These numbers are characteristic of the present embodiment, and may be superseded by design changes obvious to worker in the art.

The detailed description of the new class of ion beam generators having been completed, attention now turns to the many applications made possible and practical in an industrial sense by said generators.

There are three broad classes of surface effects upon which the aforementioned applications depend. These are: a) Surface Smoothing; b) Evaporation and Ablation from a Surface, and; c) Generation and Quenching of Non-Equilibrium Surface Structure. Other types of effects exist, and are not intended to be removed from the scope of the claims, but the effects listed above illustrate the enormous breadth of the present invention.

Surface Smoothing has a sphere of influence far wider than the innocuous name would suggest. Every surface has an energy (or surface tension) raising the energy of the atoms which make up to the surface above the energy they would have if located in the bulk of the material. Accordingly, given the opportunity any surface structure which increases the surface area (thereby increasing the number of surface atoms) will adjust by moving material around to reduce the total surface area. As described in the Background section, Surface Smoothing is driven by the surface tension of the molten surface following surface heating by the ion beam, but before sufficient heat has conducted into the body of the material to allow the near-surface regions to resolidify. During this time, the surface morphology will become less jagged and smoother, the improvement limited primarily by the duration of surface melting.

Another effect which can add to the smoothing of the surfaces of fine-grain sintered materials, such as ceramics or materials resulting from powder metallurgy, via ion beam surface melting. In these cases, when proper process parameters are used, a glass or alloy surface may be formed, thereby eliminating the grain structure from the surface in favor of a smooth glassy surface. Note further that the glass or alloy need not be equilibrium forms of the material, as the rapid quenching will preserve many forms of molecular solid solutions which do not exist in the relevant equilibrium phase diagram.

The process conditions for Surface Smoothing are not onerous, so long as the near-surface region of the material does melt to some depth. In contrast to some of the techniques to be described later. Surface Smoothing can often be carried out in a number of smaller ion pulses, each one melting the surface, thereby allowing said surface to become a little smoother.

Having described how to smooth a surface using ion beam surface heating, the range of applications of Surface Smoothing must be described. Again, these examples are simply for illustration, and there is no intent to limit the present invention to a scope inferior to that of the attached claims.

The simple process of smoothing a surface, e.g., to remove surface defects resulting from etching or machining, is straightforward. Example 1 describes the removal of etching defects on a copper surface using the Surface Smoothing process. The surface initially consisted of canyons and mountains some 3–5 $\mu$m in height having sharp edges and points. Following Surface Smoothing, the surface exhibited surface roughness only on a size scale of less than 0.5 $\mu$m.

Example 2 described the polishing of machining marks from a machinable titanium alloy. The marks were originally some 5 $\mu$m, the remnants of a precision machining operation. The process of Surface Smoothing reduced the surface roughness to less than 0.1 $\mu$m, again removing the sharp, abrupt initial features and leaving only a gently rolling surface. This polishing of machining marks will also be useful in polishing of diamond-turned optics, allowing such polishing to be executed without danger of changing the carefully controlled surface generated by the machining process, thus greatly reducing the cost of such optical elements. Another application will be in the treatment of machine tool surfaces, so that a minimum of machine marks may be made in the first place.

Example 3 describes the smoothing of an $Al_2O_3$ ceramic surface by conversion of the surface to a glassy layer. Such a process should be useful on a wide range of ceramics and other materials having a pronounced grainy structure. There are certain materials, such as most stainless steels, which do not form glassy layers. They can, however, be melted to form a solid layer of metal in these circumstances, said layer of metal having a very-fine-grained structure.

Surface Smoothing makes two primary alterations in surface morphology, it reduced the average surface roughness and it reduces the surface area of the body treated. Both of these effects have clear applications. The phenomenon of adhesion between two materials is now well-understood. However, it is clear that the more surface area upon which two materials meet, the more adhesive force will exist between them. In fact, the function of many adhesives is not only to stick to the surfaces of both bodies being glued together, but also to maximize the area of contact by flowing into small grooves and crevasses before hardening. The increase in surface area which occurs in this process is enormous, and also increases with time, explaining why fast-curing epoxies are generally not as strong as their slower-curing cousins.

If one produces a surface which is (approximately) maximally smooth using Surface Smoothing, the result will be a surface which will experience minimal adhesive forces to another body in contact. In other words, Surface Smoothing is another approach to non-stick surfaces. Note that a non-stick surface need not be a low-friction surface, as the one refers to the force required to start the body into motion and the other to the force needed to keep it in motion some moving.

Another general result of the Surface Smoothing process, resulting directly from reduction in surface roughness, is reduction of wear between two elements in contact and in relative motion. As discusses in the Background section, the amount of material lost in a given time to adhesive wear should be a linear function of the surface roughness of the two elements. Although that estimate is oversimplified, it is clear that less wear will result from the mechanical interaction of two surfaces after Surface Smoothing has been performed, beyond any surface hardening which might also have taken place.

Related to the above is the fact that a smooth surface can increase the working toughness of a material, although the actual micro-properties of that material are not altered. The materials used for mechanical applications are rarely, if ever, completely homogeneous. Among other defects, incipient surface cracks provide sites for failure of the element under stress. If the surface of such a body is essentially smoothed, all incipient cracks are located below the surface, and thus have two closed ends rather than one. Such cracks are nearly twice as resistant to growth as is a crack which intersects the surface. Thus, a smooth surface gives a tougher part.

Corrosion resistance can also be increased through the use of Surface Smoothing. Increased surface area, cracks, and other defects associated with rough surfaces increase the rate of corrosive processes, including in particular pitting, stress corrosion, and attack by microbiological organisms. A number of processes exist which directly attack the chemistry of corrosion, such as formation of a layer of corrosive-resistant surface alloy, but all such techniques work better if the surface is also smooth and relatively free of cracks. This is the role of Surface Smoothing in preventing corrosion. Several examples have been investigated, which will be discussed in the section on Non-Equilibrium Surface Structures.

An application of Surface Smoothing closely related to the above is that of passivation or protection of welds against corrosion. Exposed welds, particularly between dissimilar materials, offer fertile ground for corrosive processes. The reason is at least two-fold. Generally, the region of the weld is rather heterogeneous in composition and structure. Any corrosive process is thus likely to act with different rates in different regions, resulting in a surface of increasing micro-roughness as corrosion continues. Also, the initial surface of a weld is usually very rough, having many flaws and cracks on a small size scale. The effect of Surface Smoothing following the welding process thus acts to ameliorate both effects, resulting in a more corrosion-resistant weld.

A final illustration of the use of Surface Smoothing is in application to amorphous magnetic materials. When a thin layer of a magnetic material is considered, the surface roughness can have a significant effect of magnetic properties, including coercive field and dc hysteresis losses. An example of great industrial significance is METGLAS™, a class of magnetic alloys produced by shooting a jet of the molten alloy at a spinning metal wheel which cools the alloy into a ribbon quickly enough that the resulting structure is amorphous. One negative aspect of this means of production is that the side of the ribbon opposite the wheel has a very rough surface. This roughness also limits the thickness of material that can be commercially produced, limiting the high frequency range of METGLAS™ applications. Surface cracking of the METGLAS™ ribbon also limits the thickness of material that can be produced commercially, increasing the cost of METGLAS™ cores for power distribution and related applications. As a result, although the potential of METGLAS™ in power handling devices is enormous, it has not yet realized that potential. Surface Smoothing is a technique capable of smoothing and even forming METGLAS™, with the hoped-for improvement in magnetic properties, as described in Example 4. The technique of Surface Smoothing can, of course, be applied to any amorphous or fine-grained material, with beam kinetic energy and ion species tailored to obtain the proper cooling rate. Due to the extremely rapid quench rate, Surface Smoothing can also be used to produce or modify new magnetic materials not accessible using existing techniques.

A related technique can be applied to thin layers of amorphous or nanocrystailine material, given only that these layers are deposited on a substrate having high thermal conductivity (roughly speaking, metals and ceramics rather than polymers and insulators). The physics behind the design of a smoothing treatment is the same as above, except that the heat from the ion pulse is conducted into the substrate instead of into the bulk of a thick sample. Examples of such processes include smoothing e.g., plasma spray deposited films, filling in pinhole defects in the amorphous film, and precisely controlling the grain size of fine-grain films by melting and recrystallization.

Having described a number of applications for the process of Surface Smoothing as made possible by the present invention, attention is now focused on Evaporation and Ablation from a Surface (EAS for short). One of the most important applications of EAS is the simple task of cleaning surfaces. Simple, that is, except that one wants to consistently clean a surface to an environmentally-limited amount of contamination, without the use of EPA- of OSHA-regulated solvents, preferably immediately before using the clean surface (e.g., in welding, flux-free soldering, vacuum deposition, and the like). If cleaning is also extended to the removal of, for example, oxide layers from a metal surface, it becomes clear that cleaning can be an essential and difficult part of the manufacturing process. The process of EAS has many uses in this domain.

A conventional form of cleaning is degreasing parts prior to some assembly step, such as welding, soldering, gluing, etc. As will be shown in Example 5 below, a 100 nm thick layer of conventional lubricating oil is easily removed from a stainless steel surface using a single pulse of about 1–2 $J/cm^2$, a very small dosage for the present class of ion beam generators. Note that no attempt is made to restrict the beam to the contaminant layer alone, as an extremely low beam energy would be required, owing to the low density and small thickness of the contaminant. Rather, the ion species and the energy of the beam is adjusted to superheat a thin layer of the metal surface, which then vaporizes the hydrocarbon contaminant before the bulk of the steel can cool the surface.

A further extension of cleaning a surface is the rapid and thorough sterilization of surfaces subjected to appropriate EAS treatment. Such techniques are likely to have impact in the manufacture of the pre-sterilized medical implements.

The technique described above is quite general, and may be used on any form of contamination that has a significantly lower boiling point than the substrate material. In fact, in cases where a natural passivating layer, e.g., a surface oxide, must be removed before soldering, for example, can take place, and the relative characteristics of the bulk material and the surface passivating layer are as outlined above, the passivating layer can be removed by superheating the underlying material.

In most cases, however, the materials encountered in both natural and artificial surface layers have higher vaporization points than do the materials they protect. In such cases, the EAS technique can still be used to remove the surface layer provided only that loss of a few microns of the underlying material is acceptable. This is accomplished by ablating the surface layers of the underlying material, taking along the unwanted overlayer. The total energy required for ablation is generally quite high (>10 $J/cm^2$), and should be restricted to as thin a layer of material as is reasonable (perhaps 0.5–1.0 $\mu$m).

These numbers, like all specific numbers appearing in the specification, depend to some extent on the ion species used and the type of bulk material being processed. Note particularly the difference caused by attempting to treat a polymer substrate, whose thermal conductivity is perhaps 1000–10000 times smaller than that of a metal alloy. The ablation temperature will be about the same, and the energy contained in a given layer is perhaps 10–20% that of an equivalent metal layer, owing to the lower density of the polymer. As a result, the characteristic time to remove energy from a heated surface layer will be on the order of 10 times that for a typical metal. In addition, the range of ions in the polymer is much greater for a given beam kinetic energy than in normal structural metals. The net effect is that a much greater thickness (say, × times the distance in the metal, for example) will be heated by a beam of given kinetic energy. As the characteristic time depends quadratically on this thickness and inversely on the thermal conductivity, the characteristic time in polymer heating will be $\sim(10^2–10^3)x^2$ longer than that in a metal. Extremely rapid quenching thus cannot be produced on a polymer surface by the techniques of the present invention. The time required for heating, however, is limited only by the maximum peak power of the ion beam generator. The EAS techniques therefore apply to polymers, whereas most of the Surface Smoothing and Non-Equilibrium processes do not.

If an patterned ion-absorbing mask or compound is used to prevent the ion pulse from affecting certain areas of the element being treated, a surface having a pattern of varying surface properties can be generated. Such a pattern can range from removing an oxide layer in certain areas to obtain patterned etching of a surface by chemical action to direct etching of ablated patterns in large scale solar cells to manufacture of patterned printed circuit boards. The EAS process offers the advantage of limiting the use of solvents and powerful acids in such procedures.

When a higher level of pulse power (>>10$J/cm^2$), is deposited in a thin surface layer (~$\mu$m in thickness), violent ablation occurs. The expanding gases accelerate the evaporated layer outward from the body of the material at extreme velocity, generating as a result of momentum conservation a strong pressure wave in the material. As most materials exhibit a nonlinear stress-strain relationship, the pressure wave rapidly sharpens into a shock wave. As this shock wave propagates inward through the material, it generates dislocations, twinning planes, and complex systems of these structure defects, thereby dissipating its power and eventually (within perhaps 100 $\mu$m or more) ceases to exist as a cohesive entity. This damaged region, however, has undergone a phenomenon known as shock-hardening, an extreme form of work-hardening. Even though the direct heating action of the ion beam may be limited to the first few $\mu$m, the shock hardening effect penetrates much deeper, offering a surface treatment which cannot be directly obtained using the present invention.

EAS uses the pulsed ion beam generators of the present invention to rapidly vaporize material from the surface of a body. This vaporized material can be used as a source material for vapor deposition processes, having the advantage that chemical compositions will not be charged by segmentation effects due to the phase diagram of the alloy system or chemical reactions with a resistive heating element, as is often used in vapor phase deposition. In addition, the vapor deposition will take place in a very short period of time (<1 $\mu$s). As a result the heat of adsorption will rapidly conduct away into the bulk of the substrate, and one will again obtain a rapidly quenched material, given only that the substrate has large thermal conductivity. The large surface area that the ion beam generators of the present invention can vaporize makes this approach available to large-scale manufacturing efforts.

Another effect associated with EAS used in this mode has been observed. A layer of material a few $\mu$m thick is vaporized within the period of a few tens of nanoseconds. This converts a metal layer having a given density into a plasma which initially has very nearly the same density, as it has not yet had time to expand away from the bulk of the material. The energy distribution of this layer follows a Boltzmann distribution, meaning that a significant percentage of the vaporized material has kinetic temperatures significantly less than the average temperature of the plasma. Because of this, and because the plasma is so close to a relatively cool conducting surface, a small amount of the vaporized material redeposits on the surface from which it came. In doing so, that surface acquires a structure which is extremely rough on a nanoscale, particularly having numerous protuberances much smaller than a $\mu$m in size, possessing unique properties.

EAS processes can be used for many other manufacturing purposes, and presentation of these examples is not intended to limit the scope of the invention beyond the limitations outlined in the attached claims.

The final major class of processes made practical for large-scale manufacturing by the new category of pulsed ion beam generators made possible by the current invention is the production of non-equilibrium surface structures (NESS for short). The name is a bit misleading, as some near-equilibrium applications also come under this title, but the general concept is that one heats a surface having an initial structure rapidly to some depth with a pulsed ion beam, the heat is rapidly lost to conduction into the material, and the result is a product surface having a structure with different properties than those of the initial structure. As the structure of many of the product surfaces is non-equilibrium, that term is used herein to describe the whole family of processes.

A good example of the production and retention of high-temperature structures is offered by Example 6, in which an NESS-type process is applied to the surface of a tool steel component. (Such a process is not limited to the hardening of steel.) The hardness of the surface roughly tripled, but the important point is how this increase in hardness came about. X-ray and electron microscope analysis of the untreated surface shows the simple co-ferrite phase with a significant density of cementite precipitates. However, the treated surface showed the presence of small crystallites of austenite, the possible presence of martensite, and no carbide precipitates. This is significant in that austenite is stable only at high temperatures, and that the equilibrium structure at room temperature is a mixture of ferrite and cementite ($Fe_3C$ precipitates). At high temperature, the carbon dissolves into the matrix, producing austenite in the process. The NESS process has thus quenched a high-temperature phase structure so that it exists at room temperature. Conventionally hardened tool steels are composed either of a very fine grain pearlite or of tempered martensite. The structure obtained from the NESS treatment differs from these, thus providing another surface microstructure useful for hardening steel alloys. Other precipitates than carbon, of course, can be dissolved and retained in a non-equilibrium solid solution using the NESS technique, and other materials than steel can be successfully treated.

Another approach toward hardening the surface of steel (or other alloys) is to add elements, usually carbon and/or nitrogen, which encourages the formation of high-hardness carbides and nitrides in the near-surface region. The NESS process offers an alternate approach to the usual process of addition, which involves long periods of diffusion in hot environments. For carburization, it is possible to start by depositing a glassy layer of carbon on the surface to be treated (this deposition may use an EAS process, but need not). The layer of carbon and a suitable thickness of the underlying metal would then be melted by the pulse of an ion beam, whereupon the carbon would dissolve into the steel. Further heat treatment may be necessary to obtain optimal surface conditions, depending on the starting alloys. A similar technique which may work for nitriding would require deposition of a layer of a high-temperature nitride, such as titanium or vanadium nitride. (The titanium or vanadium also improve the properties of the resulting steel. However, this hardening process is not limited to these two elements, but may use any nitride which can withstand the high process temperatures without volatilizing.) The remainder of the process is carried out as for carbon above, save that further thermal treatment are generally not useful in nitridization. Other elements can be introduced into the surface layers of a compatible body using this type of NESS technique.

The beneficial effects of Surface Smoothing on corrosion resistance was discussed earlier. Additional phenomena more closely related to the NESS processes are also of value in holding back corrosion. This is illustrated in Example 7, in which a stainless steel surface is treated with a mixed carbon-hydrogen ion beam pulse from an early device utilizing a flashover ion source. Although this technology is primitive compared to that offered by the current invention, in particular not allowing industrial scale-up, it did prove adequate to demonstrate the increase of corrosion resistance.

When 304 stainless steel is annealed at high temperatures as described in the Example, chromium-depleted regions form near the grain boundaries of the metal. The chromium precipitates out in large chromium carbide particles in the interiors of the grains. The chromium-depleted regions are intrinsically more susceptible to corrosion, and the chromium carbide particles present intergranular surfaces which are also particularly susceptible to corrosion. As a result, 304 stainless steel, when subjected to the described heat treatment, becomes extremely susceptible to corrosion, primarily preferential grain boundary corrosion. When the heat-treated surface is subjected to a 0.3 MeV. ~300 ns pulse of mixed ions with a total energy of 2–3 J/cm$^2$, the rapid melting and recrystallization removed the chromium-depleted grain boundaries and caused the chromium carbide particles to redissolve in the metal. This treatment was observed to increase corrosion resistance essentially back to the pre-heat treatment level. Similar work aimed at studies of pitting susceptibility of 316L and 316F stainless steels has also been undertaken with similar results.

Aluminum alloys have also been subjected to NESS processes to increase their corrosion resistance. Again, the pulsed ion beam used was a mix of carbon and hydrogen ions accelerated to 0.7 MeV. The pulses were ~100 ns wide, and the total energy of each pulse was ~2–3 J/cm$^2$. Exposure testing for the alloys used was conducted in a saturated salt fog environment. The alloys treated have included 2024-T3, 6061-T6, and 7075-T6. In all cases the NESS treatment increased the corrosion resistance of the samples. This should be true for all structural aluminum alloys.

Another approach to increasing corrosion resistance through NESS treatment can be illustrated best by considering a carbon steel (i.e., low chromium content). Such steels are extremely susceptible to corrosion, rusting in moist air, disintegrating over time in saline environments, and failing even more quickly in more hostile conditions. The addition of chromium to such steels produces stainless steels, which do not share this extreme sensitivity to environment. However, stainless steel is expensive, especially considering that the mechanical properties of stainless steels are suboptimal, and that the property of being "stainless" need only exist at the surface of the element. NESS treatment can help to solve this problem by mixing a surface-deposited layer of chromium with the near-surface regions of the steel element. The result will be an element having the superior mechanical properties of carbon steel combined with an outer layer of stainless steel perhaps 5–20 $\mu$m thick (depending on conditions) which is both smooth and uniform, thus providing excellent corrosion resistance. This sort of technique is extendible to many metal alloy systems, including welds, the scope of which are well-known to practitioners in the metallurgical arts.

The Examples referred to above will now be described in detail. These Examples are not intended to limit the scope of the claims appended in any manner, but rather to illustrate their application in specific instances.

EXAMPLE 1

A sample of nominally pure Cu was etched in 1 molar nitric acid for one minute. Scanning electron microscopy (SEM) analysis of the resulting surface showed a roughened surface with hillocks and "sharp" features approximately 3–5 $\mu$m in height. These samples were treated using a single pulse of an ion beam generated using a RHEPP prototype power source and a flashover ion source. (In a flashover ion source an electrical discharge volatilizes the surface of a polymer, resulting in the generation of mixed carbon and hydrogen ions.) The beam kinetic energy was 1.0 MeV, the pulse width was approximately 60 ms, and the total pulse energy density at the treated surface was ~3J/cm$^3$.

Post-treatment SEM analysis revealed a smoother surface with more gradual changes in surface configuration and an average surface roughness of ~0.5 $\mu$m. In this example the Cu surface was molten for ~500 ns. The driving force of surface tension during this period was clearly sufficient to produce nearly complete removal of the original surface morphology.

EXAMPLE 2

A piece of Ti-6Al-4V alloy (a common machinable titanium alloy) was machined using conventional precision machining techniques, leaving a nominally flat surface with machining marks producing a surface roughness of ~5 $\mu$m. This surface was treated by exposure to four pulses, each pulse having a beam kinetic energy of ~3.0–0.4 MeV, a duration of ~400 ns, and a total pulse energy density of ~7 J/cm$^2$. SEM analysis of the treated surface revealed surface roughness had been reduced to ~0.1 $\mu$m. The time the metal surface was liquid was again some 250–500 ns, suggesting that the effect of multiple pulses in the smoothing process is additive, i.e., that more pulses give a smoother surface.

EXAMPLE 3

One side of an alumina ($Al_2O_3$ ceramic) sample was polished using submicron abrasive grit suspensions. Following characterization of the surface with an SEM, the polished surface was subjected to a single ion pulse having a beam kinetic energy of ~1.0 MeV, a beam duration of ~60 ns, and a total pulse energy density of ~10 J/cm$^2$. Post-treatment analysis showed evidence for melting and resolidification resulting in reduction of surface porosity. There remained, however, some microcracking on a 0.1 $\mu$m size scale. It is considered likely that further treatment would yield a uniformly smooth surface.

EXAMPLE 4

Because of its unique magnetic properties, various amorphous magnetic alloys known by the registered trademark (Allied-Signal, Inc.) METGLAS™ are desirable in high frequency applications, including pulsed power supplies and control. These materials are made by spraying the molten alloy on a cooled rotating wheel, thereby quenching the material at ~$10^6$ °K/sec and forming an amorphous ribbon having thicknesses in the range of 15–50 $\mu$m. Due to hydrodynamic instabilities during the cooling process, one side of such ribbons has significant ripples in thickness having a period similar to the thickness of the ribbon. This non-uniformity is important for two reasons. First, the magnetic properties at high frequencies are a function of the thickness of the ribbon; hence the variation in thickness limits the performance of devices constructed of non-uniform ribbon. Second, the size scale of the surface roughness is sufficient that when the ribbon is formed into a coil, or similar structure, the layer of insulation between alternate layers of ribbon must be very thick to prevent formation of short-circuits. The thick insulation reduced the density of magnetic material in a given construct, lowering performance and increasing the physical dimensions of the ultimate device.

An experiment was performed to discover if Surface Smoothing with ion beam pulses could even out the non-uniformities of a METGLAS™ surface while retaining the unique magnetic properties which result from the amorphous structure. METGLAS™ 2605CO material was chosen for the test, as it is perhaps most widely used in commercial applications at this time. The nominal composition of METGLAS™ 2605CO is $Fe_{56}Co_{18}B_{15}Si_1$, and it is produced using the wheel-quenching technique described above. A sample was selected, and subjected to a single 2

J/cm$^2$ pulse of mixed carbon and hydrogen ions from a flashover source. The beam kinetic energy was ~0.6 MeV, and the pulse width was ~60 ns. The resulting surface was virtually flat.

A second concern, of course, was that the nanostructure which helps to give METGLAS™ 2605CO its unique properties might be damaged by remelting and quenching at a rate different than encountered in the original manufacture. Tests have shown that the amorphous structure of the original METGLAS™ is unchanged by the ion pulse treatment.

EXAMPLE 5

A 0.1 μm layer of machining fluid (a hydrocarbon mixture) was applied to the surface of a sample of 304 stainless steel. The surface was examined using x-ray photoemission spectroscopy (XPS) to verify the thickness of the hydrocarbon layer. The sample was then exposed to three ion pulses, each having a total energy density of 2–3 J/cm$^2$, a beam kinetic energy of 0.5–0.75 MeV, and a pulse duration of ~50 ns. Following treatment, XPS was again performed, and showed only that amount of hydrocarbon expected from atmospheric contamination (about a monolayer). The surface cleaning was thus totally successful.

EXAMPLE 6

A sample of 0–1 tool steel was subjected to ion pulses to determine if the surface could be hardened thereby. The sample was subjected to a single pulse having a beam kinetic energy of ~1 MeV, a duration of ~40 ns, and a surface energy density of ~5 J/cm$^2$. On recovery, the top few microns of the sample showed only fine grains on the order of 20 nm in size, compared to the initial material which had grain size on the order of 1 μm in size. The initial material had a significant density of iron carbide precipitates, whereas the surface layers did not, having apparently redissolved the carbon into the iron matrix.

Hardness testing on the samples was done using microindentation techniques. A Knoop indentor tip was pressed into the samples with a 25 gram load, producing indentations about 5 μm in thickness. A direct reduction of this data showed that the untreated surface had a Knoop hardness of 330, while the treated surface has a Knoop hardness of 900, roughly three times higher. Further, indentation hardness tests are influenced by the hardness of the material out to a distance of perhaps 10 time the size of the indentations. Since the treated layer is only ~7 μm thick, this means that it is actually much harder than the indentation testing revealed.

θ-2θ x-ray diffraction measurements were taken of the treated and untreated surfaces. The untreated surface shows only a sharp peak corresponding to large ferrite grains (the $Fe_3C$ precipitates would not diffract at the angles examined). The treated surface, however, showed three interesting differences from the untreated surface. First, austenite peaks appeared, showing that high-temperature species had been successfully recovered in the rapid quench. Second, the diffraction peaks were all quite broad, in agreement with the observation that the grain size in the treated material was very small. Finally, the ferrite peak in the treated sample is asymmetric, suggesting the existence of lattice strains consistent with the presence of martensite. It is likely that all of these effects combine to increase the hardness of the surface of the treated sample.

EXAMPLE 7

Four flat samples of 304 stainless steel were prepared to determine if ion beam pulses could eliminate preferential grain boundary corrosion due to heat treatment. All samples were held at 1100° C. for 24 hours, and then quenched in cold water. Two of the samples were sensitized to corrosive action by heating them at 600° C. for 100 hours, followed by cooling in air. This second anneal produces precipitation of chromium carbide particles, formed through depletion of the grain boundaries of the metal of their chromium, a well-known problem in the application of stainless steels having too much carbon.

All samples were polished to a mirror finish. Two of the samples, one from each group of annealing conditions, were subjected to four pulses each having a surface energy density of ~3 J/cm$^2$, a beam kinetic energy of ~0.3 MeV, and a duration of ~300 ns. Each pulse was a combination of carbon and hydrogen ions, the ions source using flashover technology.

The degree of sensitization was determined using potentiokinetic reactivation in a 0.5M $H_2SO_4$ plus 0.01M KSCN solution held at 30° C. The charge per unit area Q/A required for reactivation is a measure of the susceptibility of the surface of the corrosive effects of this solution. The sample exposed only to the 1100° C. anneal had a Q/A value of 0.018 Coulombs/cm$^2$. The sample having the same heat treatment but also exposed to the ion beam pulse had a Q/A value of 0.057 and 0.084 Coulombs/cm$^2$ (on separate measurements), suggesting that the beam treated surface was somewhat more susceptible to corrosion.

The more important results, however, are on the samples which had undergone both annealing cycles. The sample which only received both annealing cycles had a Q/A value of 0.825 and 0.817 Coulombs/cm$^2$ (again two measurements were made), an enormous increase from the value of 0.018 for the sample which only received the high-temperature anneal. This huge difference in corrosive sensitivity explains why temperatures in the 600° C. range are avoided in application of most stainless steels. However, when such a sample is treated with the above described ion beam pulse schedule, the Q/A value dropped to 0.027 and 0.028 Coulombs/cm$^2$, a value nearly as low as the original material.

One example of why this result is important lies in the problem of welding stainless steel for applications in which corrosive environments are to be encountered. In welding there will clearly be a zone of material which will slowly cool from a temperature in the sensitization range (roughly 400°–800° C.). This zone will be somewhat sensitized to corrosion, although not to the extreme of the experimental sample described above. Unless the entire assembly can be subjected to high-temperature annealing when complete, most stainless steels will not be practical choices for corrosive environments. When stainless steels must be welded now, a steel is chosen having so little carbon that the grain boundary sensitization process cannot occur, thus solving the corrosion problem. However, low-carbon steels are generally soft and weak by comparison to other possibilities, so this choice is a compromise. The ion beam pulse surface modification technology described herein will reduce the number of design compromises required, in this problem and in many others.

The capacity of the present invention for producing high energy, high average power pulsed ion beams results in a new, low cost, compact surface treatment technology capable of high volume commercial applications and new treatment techniques not possible with existing systems. Having thus described the present invention with the aid of specific examples, those skilled in the art will appreciate that other similar combinations of the capabilities of this technology are also possible without departing from the scope of the claims attached herewith.

We claim:

1. A process for uniformly altering a characteristic of a surface of a material to a depth of<several hundred microns comprising the step of irradiating a surface of the material with a repetitively pulsed ion beam from an ion beam source *having an anode electrode and a cathode electrode, defining therebetween an acceleration gap, and producing ions created by ionizing an injected gas*, wherein each pulse of the pulsed ion beam has a duration of ≦1000 ns at [(an] *said* accelerating gap[) between an anode electrode means and a cathode electrode means n the ion beam source], a total beam energy delivered to the material of >1 Joule/pulse, an impedance of <1000Ω, a repetition rate of >1 Hz, an ion kinetic energy of >50 keV, and an ion penetration depth of <50 microns.

2. The process of claim 1 wherein the depth of ion penetration is controlled by controlling the kinetic energy of the ion beam.

3. The process of claim 1 wherein the depth of ion penetration is controlled by controlling the atomic mass of the ions in the ion beam.

4. The process of claim 1 wherein the depth of ion penetration is controlled by controlling the atomic number of the ions in the ion beam.

5. The process of claim 1 wherein the characteristic is surface smoothness which is modified to a surface roughness of <0.5 microns.

6. The process of claim 5 wherein the material is a fine grain, sintered material.

7. The process of claim 5 wherein the surface is a food preparation surface.

8. The process of claim 7 wherein the food preparation surface is a food cooking surface.

9. The process of claim 5 wherein the material is an amorphous magnetic alloy.

10. The process of claim 9 wherein the alloy has the approximate composition of $Fe_{66}Co_{18}B_{15}S_1$.

11. The process of claim 1 wherein the surface characteristic is the presence of an unwanted contaminant.

12. The process of claim 11 wherein the unwanted contaminant is a machining lubricant.

13. The process of claim 11 wherein the unwanted contaminant is solder flux.

14. The process of claim 11 wherein the unwanted contaminants is biological contamination.

15. The process of claim 11 wherein the unwanted contaminants is a surface coating.

16. The process of claim 1 wherein the total beam energy delivered to the material per pulse is <10 Joules/pulse and the surface characteristic to be altered is the presence of the top 1–2 microns of the material which is removed by ablation.

17. The process of claim 1 wherein the total beam energy delivered to the material per pulse is <20 Joules/pulse and the surface characteristic is shock hardening.

18. The process of claim 16 wherein the ablation produces vaporization of the surface of the material which redeposits upon the surface of the material.

19. The process of claim 16 wherein the ablation produces vaporization of the surface of the material which redeposits upon a surface of a second material.

20. The process of claim 16 further including protection of certain areas of the surface of the material by mask means which protect the surface from the ablation.

21. The process of claim 1 wherein the surface characteristic to be altered is hardness.

22. The process of claim 1 wherein the surface characteristic to be altered is corrosion resistance.

23. The process of claim 22 wherein the material is steel.

24. The process of claim 22 wherein the material comprises aluminum.

25. The process of claim 23 wherein the material is stainless steel that has been heat treated to above 600° C.

26. The process of claim 1 wherein the surface characteristic to be altered is resistance of welds to stress cracking.

27. The process of claim 1 wherein the surface characteristic to be altered is resistance of welds to corrosion.

28. The process of claim 1 wherein the surface characteristic to be altered is the formation of non-equilibrium structures within the surface.

29. The process of claim 28 wherein the non-equilibrium structures are selected from the group consisting of amorphous structures, disordered crystalline structures, and nanocrystalline structures not present in the original material.

30. The process of claim 1 wherein the area of continuous and uniform alteration of the characteristics is >5 $cm^2$.

31. The process of claim 1 wherein the ion species are selected from the group consisting of hydrogen, helium, oxygen, nitrogen fluorine, neon, chlorine, argon, lithium, beryllium, boron, carbon, sodium, magnesium, aluminum, silicon, phosphorous, sulfur, potassium and the isotopes thereof.

32. The process of claim 1 wherein the material is selected from the group consisting of intermetallic materials, amorphous materials, crystalline materials, nano-crystalline materials, dielectrics, polymers, semiconductors, ceramics and glasses.

*33. A method of smoothing a surface of a bulk material comprising:*

*(a) generating an ion beam using a magnetically confined anode plasma ion source comprising a vacuum chamber having an anode assembly including an anode electrode and a fast driving coil and a cathode assembly including a cathode electrode and a slow driving coil, the anode electrode and cathode electrode defining there between an acceleration gap said step of generating further comprising:*

*(i) introducing a puff of gas into said vacuum chamber to produce a localized volume of gas adjacent said fast driving coil but insulated from said fast driving coil;*

*(ii) pre-ionizing said gas using said fast driving coil;*

*(iii) further ionizing said gas while moving said gas away from said fast driving coil to create a thin, magnetically confined plasma layer;*

*(iv) applying a pulsed power signal to said anode electrode to form an ion beam from said plasma;*

*(v) extracting said ion beam with little or no rotation thereof; and*

*(b) directing said beam at said surface to reduce the total surface area.*

*34. The method according to claim 33, wherein said step of directing comprises melting a near surface layer of said bulk material, and resolidifying said near surface layer without melting said bulk material.*

*35. The method according to claim 34 further comprising controlling the duration of exposure of said surface to said ion beam to improve surface morphology.*

*36. The method according to claim 34, wherein said bulk material is a fine grain sintered material.*

37. The method according to claim 36, wherein said material includes ceramic materials and powder metallurgy materials.

38. The method according to claim 36, wherein said steps of melting and resolidifying produce a glassy surface.

39. The method according to claim 36, wherein said steps of melting and resolidifying produce a alloy surface.

40. The method according to claim 38, wherein said surface comprises a non-equilibrium form of the bulk material.

41. The method according to claim 39, wherein said surface comprises a non-equilibrium form of the bulk material.

42. The method according to claim 34, wherein said method is repeated whereby said surface is repeatedly melted, each time resulting in a smoother surface.

43. The method according to claim 34, further comprising the step of removing surface defects.

44. The method according to claim 43, wherein said surface defects comprise machining marks from a machining process.

45. The method according to claim 44, wherein said post smoothing process surface is free of sharp or abrupt features.

46. The method according to claim 44, wherein the surface contour generated by the machining process is unchanged by the smoothing process.

47. The method according to claim 34, wherein the surface to be smoothed is a wear surface.

48. The method according to claim 43, wherein said surface defect comprises a surface crack.

49. The method according to claim 43, wherein said surface defects comprises potential corrosion sites and said method results in a corrosion resistant surface.

50. The method according to claim 34, wherein said bulk material comprises an amorphous magnetic material.

51. The method according to claim 34, wherein said bulk material comprises a nanocrystalline material.

52. The method according to claim 51, wherein said bulk material is formed in thin layers deposited on substrate having a relatively high thermal conductivity and wherein said method further comprises directing said ion beam onto said substrate.

53. The method according to claim 51, wherein defects in the bulk material are removed by melting and recrystallization.

54. The method according to claim 33 further comprising the step of melting a near surface layer of said bulk material followed by the step of rapid thermal quenching.

55. The method according to claim 54, wherein said step of rapid thermal quenching comprises removing heat at a rate greater than about $10^8$ k/sec.

56. The method according to claim 36, wherein the bulk material is a ceramic and a glassy surface is formed.

57. The method according to claim 37, wherein the bulk material is a powder metallurgy material and an alloy surface is formed.

58. The method according to claim 36, wherein a surface having reduced surface porosity is formed.

59. A method of evaporation and ablation from a surface comprising the steps of:

(a) generating ion beam using a magnetically confined anode plasma ion source comprising a vacuum chamber having an anode assembly including an anode electrode and a fast driving coil and a cathode assembly including a cathode electrode and a slow driving coil, the anode electrode and cathode electrode defining therebetween an acceleration gap; said step of generating further comprising:

(i) introducing a puff of gas into said vacuum chamber to produce a localized volume of gas adjacent said fast driving coil but insulated from said fast driving coil;

(ii) pre-ionizing said gas using said fast driving coil;

(iii) further ionizing said gas while moving said gas away from said fast driving coil to create a thin, magnetically confined plasma layer;

(iv) applying a pulsed power signal to said anode electrode to form an ion beam from said plasma;

(v) extracting said ion beam with little or no rotation thereof; and (b) directing said ion beam at said surface to evaporate a layer of said surface.

60. The method according to claim 59, wherein said surface comprises a layer and an underlying surface of bulk material and further comprising the steps of removing at least said layer.

61. The method according to claim 60, wherein said bulk material is metal and said layer is an oxide layer.

62. The method according to claim 60, wherein said bulk material is metal and said layer is a hydrocarbon.

63. The method according to claim 60, wherein said layer is a contamination layer, said contamination having a boiling point lower than that of said bulk material.

64. The method according to claim 60, wherein said layer is a passivation layer and said bulk material is part of a substrate, said passivation layer having a lower boiling point than said substrate; and further comprising the step of removing said passivation layer by super heating the surface of said substrate by said ion beam.

65. The method according to claim 60, wherein said layer is an overlayer of an unwanted material having a higher vaporization point than the bulk material, said method further comprising ablating a surface layer of the bulk material beneath said overlayer, thereby removing said unwanted material.

66. The method according to claim 60, wherein said bulk material is a polymer substrate.

67. The method according to claim 59, wherein the step of directing further comprises interposing a mask or compound to prevent said ion beam from effecting selected portions of said surface.

68. The method according to claim 65, further comprising the step of shock-hardening of the bulk material to a depth greater than the melt depth.

69. The method according to claim 59, further comprising the step of redepositing vaporized material onto said surface.

70. A method of producing non-equilibrium or near equilibrium structures on the surface of a bulk material comprising the steps of:

(a) generating an ion beam using a magnetically confined anode plasma ion source comprising a vacuum chamber having an anode assembly including an anode electrode and a fast driving coil and a cathode assembly including a cathode electrode and a slow driving coil, the anode electrode and cathode electrode defining therebetween an acceleration gap, said method comprising the steps of:

(i) introducing a puff of gas into said vacuum chamber to produce a localized volume of gas adjacent said fast driving coil but insulated from said fast driving coil;

(ii) pre-ionizing said gas using said fast driving coil;

(*iii*) *further ionizing said gas while moving said gas away from said fast driving coil to create a thin, magnetically confined plasma layer;*

(*iv*) *applying a pulsed power signal to said anode electrode to form an ion beam from said plasma;*

(*v*) *extracting said ion beam with little or no rotation thereof;*

(*b*) *heating a bulk material having an initial structure to a predetermined depth with said ion beam; and*

(*c*) *rapidly conducting the heat into said bulk material whereby a surface having a structure different from said initial structure is formed.*

*71. The method according to claim 70, wherein said bulk material is a metal alloy.*

*72. The method according to claim 70, further comprising the step of depositing a layer of material on the bulk material and whereby the step of heating further comprises melting said layer of material and a surface layer of said bulk material whereby said material is dissolved into said melted bulk material.*

*73. The method according to claim 72, wherein said layer material comprises carbon and said bulk material comprises steel.*

*74. The method according to claim 72, wherein said layer material comprises a nitride and said bulk material comprises steel.*

*75. The method according to claim 72, wherein said bulk material is selected from the group consistent of 304 stainless steel, 316 L stainless steel and 316 F stainless steel.*

*76. The method according to claim 72, wherein said bulk material comprises an aluminum alloy.*

*77. The method according to claim 72, wherein said layer material is chromium and said bulk material is carbon steel and wherein said step of melting further comprises melting said chromium and carbon steel.*

*78. The method according to claim 72, wherein the layer material and bulk material are immiscible when solid and wherein the step of melting further comprises forming a single phase liquid comprised of the layer material and bulk material.*

*79. The method according to claim 78, wherein said step of rapidly conducting heat further comprises quenching the molten material produced an amorphous alloy consisting of said layer material and said bulk material.*

*80. The method according to claim 78 wherein said step of rapidly conducting heat comprises quenching at a rate whereby nanoscale precipitates are formed after quenching.*

*81. The method according to claim 72 further comprising the step of rapid quenching whereby an alloy of said bulk material and layer material is formed.*

*82. The method according to claim 81, wherein said alloy comprises a metastable alloy on the surface of said bulk material.*

*83. The method according to claim 70, wherein said bulk material is a fine-grain sintered material.*

*84. The method according to claim 83, wherein said bulk material is a ceramic and a glossy surface is formed.*

*85. The method according to claim 83, wherein said bulk material is a powdered metallurgy material and an alloy surface is formed.*

* * * * *